US007102219B2

(12) United States Patent
Hanaoka et al.

(10) Patent No.: US 7,102,219 B2
(45) Date of Patent: Sep. 5, 2006

(54) SEMICONDUCTOR DEVICE, METHOD OF FABRICATING THE SAME, STACK-TYPE SEMICONDUCTOR DEVICE, CIRCUIT BOARD AND ELECTRONIC INSTRUMENT

(75) Inventors: Terunao Hanaoka, Suwa (JP); Kenji Wada, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 131 days.

(21) Appl. No.: 10/767,999

(22) Filed: Feb. 2, 2004

(65) Prior Publication Data
US 2004/0155355 A1 Aug. 12, 2004

Related U.S. Application Data

(62) Division of application No. 09/870,710, filed on Jun. 1, 2001, now Pat. No. 6,720,661.

(30) Foreign Application Priority Data

| Jun. 2, 2000 | (JP) | ............................. | 2000-166104 |
| Nov. 7, 2000 | (JP) | ............................. | 2000-338737 |
| Apr. 24, 2001 | (JP) | ............................. | 2001-125581 |

(51) Int. Cl.
*H01L 23/02* (2006.01)
(52) U.S. Cl. ...................... 257/686; 257/777
(58) Field of Classification Search ................ 257/686, 257/777, 723
See application file for complete search history.

(56) References Cited

U.S. PATENT DOCUMENTS

| 4,696,885 A | 9/1987 | Vijan | |
| 4,984,358 A | 1/1991 | Nelson | ........................ 438/109 |
| 5,229,647 A | 7/1993 | Gnadinger | .................. 257/783 |
| 5,548,118 A | 8/1996 | Walker | ........................ 250/332 |
| 5,825,080 A * | 10/1998 | Imaoka et al. | ............... 257/659 |
| 5,926,951 A | 7/1999 | Khandros et al. | ............. 29/843 |
| 5,949,140 A | 9/1999 | Nishi et al. | |
| 6,150,188 A | 11/2000 | Geusic et al. | .................. 438/31 |
| 6,222,276 B1 | 4/2001 | Bertin et al. | ................. 257/778 |
| 6,225,651 B1 | 5/2001 | Billon | ........................ 257/200 |
| 6,404,061 B1 | 6/2002 | Hikita et al. | |

FOREIGN PATENT DOCUMENTS

| JP | 63-126250 | 5/1988 |
| JP | A-03-253025 | 11/1991 |
| JP | 05-029537 | * 2/1993 |
| JP | A-05-029537 | 2/1993 |
| JP | A5-206286 | 8/1993 |
| JP | A-05-251455 | 9/1993 |
| JP | A-06-310547 | 11/1994 |
| JP | A 8-83881 | 3/1996 |
| JP | A-08-124930 | 5/1996 |

(Continued)

*Primary Examiner*—Phat X. Cao
(74) *Attorney, Agent, or Firm*—Oliff & Berridge, PLC

(57) ABSTRACT

A method of fabricating a semiconductor device including: a first step of forming a through hole in a semiconductor element having electrodes on a first surface; and a second step of forming a conductive layer which is electrically connected to the electrodes and is provided from the first surface through an inner wall of the through hole to a second surface of the semiconductor element which is opposite to the first surface. The conductive layer is formed to have connecting portions on the first and second surfaces so that a distance between at least two electrodes among the electrodes is different from a distance between the connecting portions on at least one of the first and second surfaces, in the second step.

3 Claims, 17 Drawing Sheets

FOREIGN PATENT DOCUMENTS

| | | |
|---|---|---|
| JP | A-08-330313 | 12/1996 |
| JP | 52065666 A | 5/1997 |
| JP | A-09-246318 | 9/1997 |
| JP | 9-321175 | 12/1997 |
| JP | A 10-223833 | 8/1998 |

* cited by examiner

US 7,102,219 B2

SEMICONDUCTOR DEVICE, METHOD OF FABRICATING THE SAME, STACK-TYPE SEMICONDUCTOR DEVICE, CIRCUIT BOARD AND ELECTRONIC INSTRUMENT

This is a divisional of application Ser. No. 09/870,710 filed Jun. 1, 2001, U.S. Pat. No. 6,720,661 and is hereby incorporated by reference in its entirety.

Japanese Patent Application No. 2000-166104 filed on Jun. 2, 2000, Japanese Patent Application No. 2000-338737 filed on Nov. 7, 2000 and Japanese Patent Application No. 2001-125581 filed on Apr. 24, 2001 are hereby incorporated by reference in their entirety.

TECHNICAL FIELD

The present invention relates to a semiconductor device, a method of fabricating the same, a stack-type semiconductor device, a circuit board and an electronic instrument.

BACKGROUND

Recently, a semiconductor device having a plurality of semiconductor chips stacked thereon has been developed. Many of them have been intended for electrical connection where electrodes of the semiconductor chips are bonded with wires or leads. However, the provision of the wires has imposed limitations on downsizing.

Additionally, it has been developed that a thorough hole is formed in the semiconductor chip and molten solder is filled in the through hole for electrical connection. However, when the solder is filled in a narrow through hole, a void is generated and thus the reliability in electrical connection is hard to secure.

SUMMARY

A method of fabricating a semiconductor device according to the present invention comprises:

a first step of forming a through hole in a semiconductor element having a plurality of electrodes on a first surface; and a second step of forming a conductive layer which is electrically connected to the electrodes and is provided from the first surface through an inner wall of the through hole to a second surface of the semiconductor element which is opposite to the first surface, wherein the conductive layer is formed to have connecting portions on the first and second surfaces so that a distance between at least two electrodes among the plurality of electrodes is different from a distance between the connecting portions on at least one of the first and second surfaces, in the second step.

A semiconductor device according to the present invention comprises:

a semiconductor element having a through hole and a plurality of electrodes formed on a first surface of the semiconductor element;

a conductive layer which is electrically connected to the electrodes, and is provided from the first surface through an inner wall of the through hole to a second surface of the semiconductor element which is opposite to the first surface; and a plurality of connecting portions provided on the conductive layer so that a distance between two connecting portions among the plurality of connecting portions is different from a distance between at least two electrodes among the plurality of electrodes, on at least one of the first and second surfaces.

A stack-type semiconductor device according to one aspect of the present invention is formed by stacking a plurality of semiconductor devices, and at least an undermost semiconductor device among the plurality of semiconductor devices is the above-described semiconductor device.

A stack-type semiconductor device according to another aspect of the present invention is formed by stacking a plurality of the above semiconductor devices, and adjacent semiconductor devices among the plurality of the semiconductor devices are electrically connected by the conductive layer.

Over a circuit board according to the present invention, the above-described semiconductor device is mounted.

An electronic instrument according to the present invention comprises the above-described semiconductor device.

DETAILED DESCRIPTION OF THE EMBODIMENTS

Figure 1:
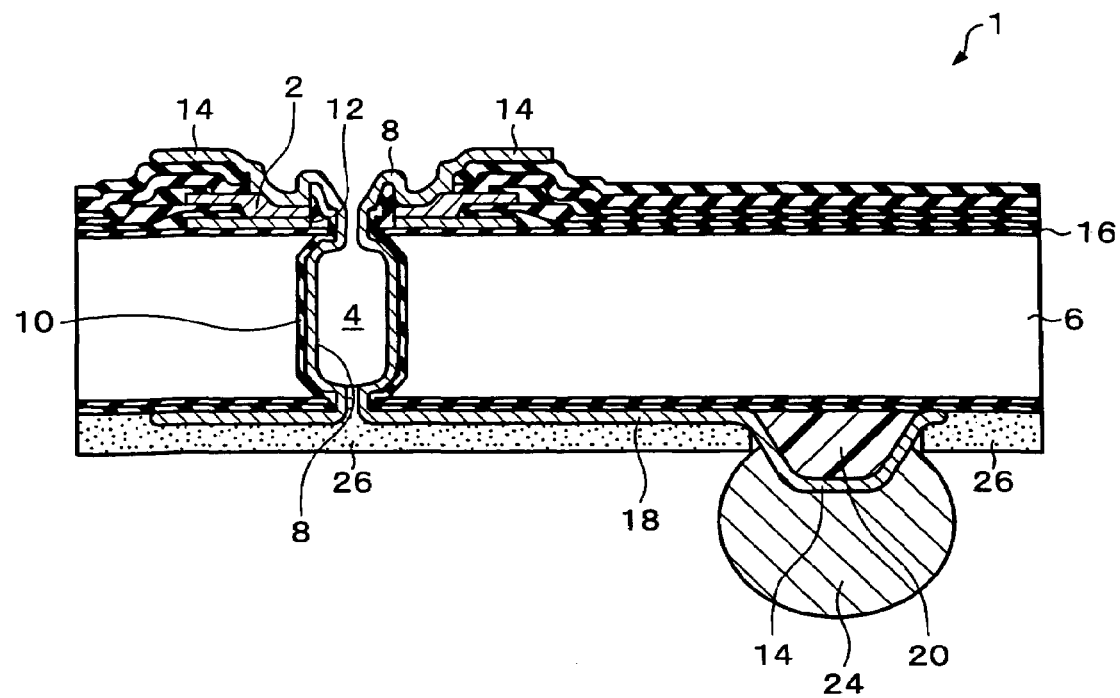
FIG. 1 is a cross section illustrating an enlarged principal part of the semiconductor device according to a first embodiment of the present invention.

The embodiments of the present invention can provide a semiconductor device capable of solving the problems as set forth, electrically connecting stacked semiconductor elements to each other easily with high reliability and implementing reduction in size, a method of fabricating such a semiconductor device, a stack-type semiconductor device, a circuit board and an electronic instrument.

(1) A method of fabricating a semiconductor device according to the embodiments of the present invention comprises:

a first step of forming a through hole in a semiconductor element having a plurality of electrodes on a first surface, and a second step of forming a conductive layer which is electrically connected to the electrodes and is provided from the first surface through an inner wall of the through hole to a second surface of the semiconductor element which is opposite to the first surface, wherein the conductive layer is formed to have connecting portions on the first and second surfaces so that a distance between at least two electrodes among the plurality of electrodes is different from a distance between the connecting portions on at least one of the first and second surfaces in the second step.

According to the embodiments the electrical connection between one surface and the other surface of the semiconductor element can be achieved by forming the conductive layer within the through hole. Since the conductive layer is not formed by filling a melting material in the though hole, problems such as the generation of voids will not occur and the high reliability in electrical connection can be secured.

Furthermore, routing the conductive layer in a predetermined shape can change the pitch among a plurality of the connecting portions. When a plurality of the semiconductor elements are stacked, for example, a degree of freedom in connection can be enhanced among the semiconductor elements.

(2) In the method of fabricating a semiconductor device, a small hole which has a diameter smaller than a diameter of the through hole may be previously formed and enlarged to form the through hole, in the first step.

This makes it possible to form the through hole easily.

(3) In the method of fabricating a semiconductor device a depression may be formed at a position in which the small hole is to be formed.

Since the position in which the through hole is to be formed can be confirmed by the depression, the through hole can be formed at an exact position.

(4) In the method of fabricating a semiconductor device, the small hole may be formed by a laser beam and the small hole is enlarged by wet etching.

The through hole can be thus formed easily. In addition, even when the inner wall of the small hole formed by the laser beam is rough, it is enlarged by wet etching and thus the through hole having a smooth inner wall can be obtained.

(5) In the method of fabricating a semiconductor device, a hole communicating with the through hole may be formed in each of the electrodes.

(6) In the method of fabricating a semiconductor device, the through hole may be formed in an end portion of the semiconductor element; and the connecting portions may be disposed in a center portion of the semiconductor element, on the inside of the through hole.

By providing the connecting portions in the center of the semiconductor element and on the inside of the though hole, the pitch between the connecting portions can be changed in a broad area.

(7) The method of fabricating a semiconductor device may further comprise a step of forming a stress relieving layer on at least one of the first and second surfaces before the second step and the conductive layer may be formed to reach the stress relieving layer in the second step.

This makes it possible to relax the stress applied to the conductive layer by the stress relieving layer.

(8) In the method of fabricating a semiconductor devices in the step of forming a stress relieving layer the stress: relieving layer may comprise a plurality of projections; and in the second step, the conductive layer may be formed to reach the projections.

The projections can be utilized as bumps.

(9) In the method of fabricating a semiconductor device, in the step of forming a stress relieving layer the stress relieving layer may comprise a plurality of projections, a plurality of recessed portions may be formed between the adjacent projections; and in the second step, the conductive layer may be formed to reach the recessed portions.

(10) In the method of fabricating a semiconductor device, the stress relieving layer may be formed of a resin.

(11) In the method of fabricating a semiconductor device, the connecting portions may be formed on the stress relieving layer.

Thus the stress applied to the conductive layer can be relaxed by the stress relieving layer.

(12) In the method of fabricating a semiconductor device, a distance between adjacent connecting portions among the connecting portions may be wider than a distance between adjacent electrodes among the plurality of electrodes.

When the semiconductor elements are stacked, for example, the semiconductor elements can be electrically connected easily by using the connecting portions.

(13) The method of fabricating a semiconductor device may further comprise a step of providing external terminals at the connecting portions.

(14) In the method of fabricating a semiconductor device, a solder may be provided into a thick layer on the connecting portions to form solder balls by wet back in the step of providing the external terminals.

(15) In the method of fabricating a semiconductor device a solder may be provided on the connecting portions by electroplating or printing.

(16) The method of fabricating a semiconductor device may further comprise a step of forming a protective film over an area except at least the connecting portions after the second step.

(17) The method of fabricating a semiconductor device may further comprise a step of forming an insulating film over an area including the inner wall of the through hole after the first step and before the second step, and the conductive layer may be formed on the insulating film in the second step.

The short circuit of the semiconductor element with the conductive layer can be thus prevented in the area except the electrodes.

(18) In the method of fabricating a semiconductor device, the insulating film may be formed by coating a resin over an area including the inner wall of the through hole.

This makes it possible to form the insulating film for a short time with low costs without using a special apparatus.

(19) In the method of fabricating a semiconductor device, the through hole may be filled with a resin in the step of forming the insulating film; and the conductive layer may be formed within the through hole, through the resin in the second step Thus the insulating film can be formed for a short time with low costs without using a special apparatus.

(20) In the method of fabricating a semiconductor device, the semiconductor element may be a semiconductor chip.

(21) In the method of fabricating a semiconductor device, the semiconductor element may be a part of a semiconductor wafer.

(22) The method of fabricating a semiconductor device may further comprise a step of stacking semiconductor devices fabricated by the above-described method, and electrically connecting adjacent two semiconductor devices by the conductive layer.

Three-dimensional mounting is applied to this method of fabricating a semiconductor device.

(23) The method of fabricating a semiconductor device may comprise the steps of:

stacking semiconductor devices fabricated by the above-described method, and electrically connecting adjacent two semiconductor devices by the conductive layer; and cutting the semiconductor wafer into separate pieces.

(24) A semiconductor device according to the embodiments of the present invention comprises:

a semiconductor element having a through hole land a plurality of electrodes formed on a first surface of the semiconductor element;

a conductive layer which is electrically connected to the electrodes, and is provided from the first surface through an inner wall of the through hole to a second surface of the semiconductor element which is opposite to the first surface; and a plurality of connecting portions provided on the conductive layer so that a distance between two connecting portions among the plurality of connecting portions is different from a distance between at least two electrodes among the plurality of electrodes, on at least one of the first and second surfaces.

According to the embodiments, the electrical connection between one surface and the other surface of the semiconductor element can be achieved by forming the conductive layer within the through hole. Since the conductive layer is not formed by filling a melting material in the though hole, problems such as the generation of voids will not occur and the high reliability in electrical connection can be secured.

Furthermore, routing the conductive layer in a predetermined shape can change the pitch among a plurality of the connecting portions. When a plurality of the semiconductor elements are stacked, for example, a degree of freedom in connection can be enhanced among the semiconductor elements.

(25) In the semiconductor device, the through hole may be formed in an end portion of the semiconductor element; and the connecting portions may be disposed in a center portion of the semiconductor element, on the inside of the through hole.

By providing the connecting portions in the center of the semiconductor element and on the inside of the though hole, the pitch between the connecting portions can be changed in a broad area.

(26) The semiconductor device may further comprise a stress relieving layer formed on at least one of the first and second surfaces, and the conductive layer maybe formed to reach the stress relieving layer.

The stress applied to the conductive layer can be relaxed by the stress relieving layer.

(27) In the semiconductor device, the stress relieving layer may comprise a plurality of projections; and the conductive layer may be formed to reach the projections.

The projections can be utilized as bumps.

(28) In the semiconductor device, the stress relieving layer may comprise a plurality of projections; a plurality of recessed portions may be formed between the adjacent projections; and the conductive layer may be formed to reach the recessed portions.

(29) In the semiconductor device, the stress relieving layer may be formed of a resin.

(30) In the semiconductor device, the connecting portions may be formed on the stress relieving layer.

(31) In the semiconductor device, a distance between adjacent connecting portions among the connecting portions may be wider than a distance between adjacent electrodes among the plurality of electrodes.

When the semiconductor elements are stacked, for example, the semiconductor elements can be electrically connected easily by using the connecting portions.

(32) The semiconductor device may further comprise external terminals provided at the connecting portions.

(33) In the semiconductor device, a protective film may be formed over an area except the connecting portions.

(34) In the semiconductor device, an insulating film may be formed over an area including the inner wall of the through hole; and the conductive layer may be formed on the insulating film.

The short circuit of the semiconductor element with the conductive layer can be thus prevented in the area except the electrodes.

(35) In the semiconductor device, the semiconductor element may be a semiconductor chip.

(36) In the semiconductor device, the semiconductor element may be a part of a semiconductor wafer.

(37) A stack-type semiconductor device according to the embodiments of the present invention is formed by stacking a plurality of semiconductor devices, and at least an undermost semiconductor device among the plurality of semiconductor devices is the above-described semiconductor device.

(38) A stack-type semiconductor device according to the embodiments of the present invention is formed by stacking a plurality of the above-described semiconductor devices, and adjacent semiconductor devices among the plurality of the semiconductor devices are electrically connected by tithe conductive layer.

Only stacking them makes it possible to electrically connect adjacent semiconductor devices to each other. Thus, a small-sized stack-type semiconductor device can be obtained.

(39) A stack-type semiconductor device according to the embodiments of the present invention is formed by stacking a plurality of the above-described semiconductor devices, and adjacent semiconductor devices among the plurality of the semiconductor devices are electrically connected by the conductive layer; and in a pair of semiconductor devices among the plurality of the stacked semiconductor devices, the projections of the stress relieving layers are arranged to face each other.

The projections can be utilized as bumps. In addition, the projections of the stress relieving layer can relax the stress applied between the semiconductor chips.

(40) A stack-type semiconductor device according to the embodiments of the present invention, comprises a first semiconductor device and a second semiconductor device which are stacked, the first semiconductor device is the above-described semiconductor device, in which the stress relieving layer comprises a plurality of projections, and the conductive layer is formed to reach the projections;

the second semiconductor device is the above-described semiconductor device, in which the stress relieving layer comprises a plurality of projections, a plurality of recessed portions are formed between the adjacent projections, and the conductive layer is formed to reach the recessed portions; and the adjacent first and second semiconductor devices are electrically connected by the conductive layer, the projections in the first semiconductor device entering the recessed portions in the second semiconductor device.

This makes it possible to reliably implement the electrical connection between the connecting portions. Specifically, the contact area between the connecting portions can be made greater.

(41) In the stack-type semiconductor device, an undermost semiconductor device may be arranged so that the first surface of the semiconductor element faces other stacked semiconductor devices.

Since the surface opposite to the surface where the electrodes are formed in the semiconductor element faces to the circuit board, for example, damage to the semiconductor device when mounting or after that can be reduced.

(42) Over a circuit board according to the embodiments of the present invention, the above-mentioned semiconductor device is mounted.

(43) An electronic instrument according to the embodiments of the present invention comprises the above-mentioned semiconductor device.

The embodiments of the present invention will b described below with reference to the accompanying drawings. However, the present invention is not limited to the following embodiments.

First Embodiment

Figure 2:
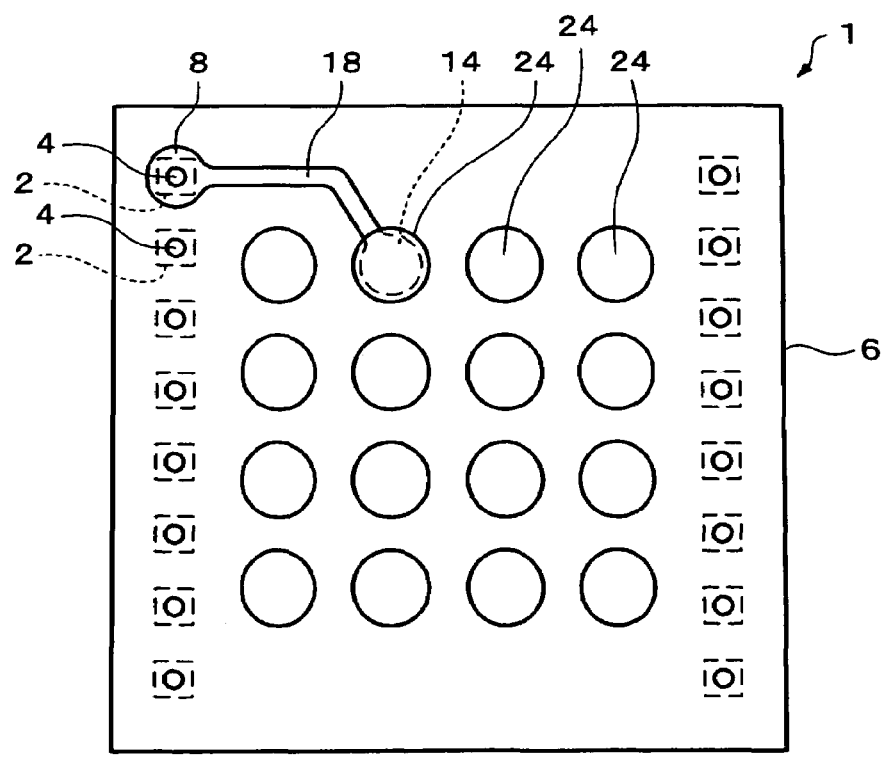
FIG. 2 is a plan view illustrating the semiconductor device according to the first embodiment of the present invention.

FIG. 1 depicts a cross-sectional view illustrating an enlarged principal part of a semiconductor device in the first embodiment of the invention. FIG. 2 depicts a plan view illustrating the semiconductor device in the first embodiment of the invention. In detail, FIG. 2 depicts a plan view showing the opposite side to electrodes 2 in a semiconductor chip 6, a part of a conductive layer 8 (including connecting parts 14 and wires 18) and a solder resist layer 26 are omitted. In the description shown below, a semiconductor chip is exemplified for explanation, however, the embodiment may be applied to a semiconductor wafer.

A semiconductor device 1 in the embodiment may be one that is classified as a so-called CSP (Chip Scale/Size Package). The semiconductor device 1 includes a semiconductor chip 6 (a semiconductor element) having the electrodes 2 and formed with a through hole 4 and the conductive layer 8 formed on the area containing the inner side (the inner wall surface) of the through hole 4. Then, the conductive layer 8 is formed so that it reaches on the surface of the semiconductor chip 6 and so that a part thereof becomes the wire 18 on the surface of the semiconductor chip 6.

The outer shape of the semiconductor chip 6 is generally a rectangular parallelepiped (including a cube). However, the embodiment is not limited to this, it may be spherical. The semiconductor chip 6 has an insulating film (an interlayer film) 16 on the surface where an integrated circuit comprised of a transistor or a memory element not shown. The insulating film 16 is generally a silicon oxide film that is a basic material of the semiconductor chip 6.

On the insulating film 16, the electrodes (pads) 2 are formed which are electrically connected to the integrated circuit at a portion not shown. The electrodes 2 are generally formed of metal used for a wiring pattern of the integrated circuit, being formed of aluminium, aluminium-based alloy or copper. The electrodes 2 are arranged along at least one side (generally two sides or four sides) on the surface of the semiconductor chip 6. The electrodes 2 are generally formed on the surface (an active side) on the side where the integrated circuit is formed in the semiconductor chip 6. The electrodes 2 are generally formed outside the integrated circuit forming area (an active area) of the integrated circuit, however, they may be formed inside the area. Additionally, the electrodes 2 may be arranged in the end part of the surface of the semiconductor chip 6 or may be arranged in the center part thereof.

As shown in FIG. 1, the through hole 4 penetrates through the semiconductor chip 6 from the surface (a first surface) where the electrodes 2 are formed to the opposite surface (a second surface) thereto in the semiconductor chip 6. The through hole 4 may be formed in the number equal to that of the electrodes 2, less or more than the number of the electrodes 2. The through hole 4 is preferably formed outside the forming area of the semiconductor chip 6. That is, the through hole 4 may be formed on the end part side of the semiconductor chip 6. Additionally, as shown in FIG. 2, the through hole 4 may be formed at positions overlapping the electrodes 2 when seeing the plan of the semiconductor chip 6. The topology of the through hole 4 is not limited, being formed freely depending on the forming method thereof. For example, as shown in FIG. 1, the through hole 4 may be formed to have a wider middle part than the width of the opening end part. Alternatively, the through hole 4 may be formed to have the same width as that of the opening end part and a vertical wall surface.

The semiconductor chip 6 is intended to have the electrical connection between the active side (the upper side surface in FIG. 1) and the non-active side (the under side surface in FIG. 1) by the conductive layer 8. That is, the conductive layer 8 is formed to reach from the inner wall surface of the through hole 4 to the top of the active surface (the first side) and to the top of the surface (the second side) opposed to the active surface. The electrodes 2 may be formed with a hole 12 communicating with the through hole 4 via an insulating film 10. The conductive layer 8 is formed to be deposited at least on a part of the electrode 2. Inside the through hole 4, the insulating film 10 is formed under the conductive layer 8 for electrically cutting off the electrical connection to the integrated circuit formed inside the semiconductor chip 6.

As shown in FIGS. 1 and 2, the conductive layer 8 is formed so that a part thereof is to be the wire 18 on the top of the semiconductor chip 6. In other words, a part of the conductive layer 8 (the wire 18) is formed in the area extending from the through hole 4 on the top of the semiconductor chip 6. For example, as shown in FIG. 2, when the through hole 4 is formed on the end part side of the semiconductor chip 6, the wire 18 is formed in the area extending to the center side than the through hole 4 in the semiconductor chip 6. The wire 18 is connected to a part of the conductive layer 8 that is formed on the opening end part of the through hole 4 on the top of the semiconductor chip 6 so as to surround the through hole 4, and the wire 18 is formed to extend therefrom. That is, as shown in FIG. 2, on the top of the semiconductor chip 6, a part of the conductive layer 8 surrounding the through hole 4 two-dimensionally and the other part of the conductive layer 8 extending therefrom to be the wire 18 are formed. The wire 18 (the conductive layer 8) is routed from the through hole 4 to form into a predetermined shape and thereby the pitch can be converted. That is, the pitch between electrical connecting portions (external terminals 24 in FIG. 2) to the electrodes 2 becomes wider than that between the electrode 2. Furthermore, the pitch conversion provides the electrical connecting portions of the semiconductor chip 6 in an area as a constant surface. Therefore, there is advantage that a degree of freedom in connection to other members (the semiconductor chip, a wafer or a circuit board) is increased.

In the example shown in FIGS. 1 and 2, the wire 18 (the conductive layer 8) is formed on the opposite surface to the surface where the electrodes 2 are formed in the semiconductor chip 6. Alternatively, as described later, the wire 18 may be formed on the surface where the electrodes 2 are formed in the semiconductor chip 6 or may be formed on both surfaces.

On the semiconductor chip 6, connecting portions 14 for electrically conducting the electrodes 2 are formed. The connecting portions 14 may be formed as a part of the conductive layer 8. The connecting portions 14 may be formed on the opening end part of the through hole 4 on the top of the semiconductor chip 6 so as to surround the through hole 4. Additionally, the connecting portions 14 may be formed as a part of the wire 18. When the connecting portions 14 are formed on a part of the wire 18, the pitch between the adjacent connecting portions 14 can be made wider than that between the adjacent electrodes 2 by routing the wire 18 to form into a predetermined shape. In this case, as shown in FIG. 2, the connecting portions 14 are often pitch-converted into a grid that spreads two-dimensionally on the surface of the semiconductor chip 6. The connecting portions 14 are preferably formed into a land having a wider area than the width of the wire 18. The connecting portions 14 may have the surface plated such as gold plating.

In addition, the conductive layer 8 is formed so that the pitch between the connecting portions 14 is varied from the pitch between at least two of the electrodes 2 among a plurality of the electrodes 2.

A stress relieving layer may be formed on the top of the semiconductor chip 6. The stress relieving layer has the function of relaxing a stress. The stress relieving layer may be formed of a resin or other materials. The stress relieving layer is formed on one surface or both surfaces of the semiconductor chip 6. In detail, the stress relieving layer is formed on the surface where the electrodes 2 of the semiconductor chip 6 are formed, the surface opposite thereto or both the surfaces. Additionally, when the through hole 4 is formed on the end part side of the semiconductor chip 6, for example, the stress relieving layer may be formed on the center side than the through hole 4 on the surface of the semiconductor chip 6. A thickness and a plane area of the stress relieving layer can be determined freely in consideration of the reliability of the semiconductor device.

The conductive layer 8 is formed to reach above the stress relieving layer. Specifically, at least a part of the conductive layer 8 that configures the wire 18 is formed on the stress relieving layer. Additionally, the connecting portions 14 are preferably formed on the stress relieving layer. That is, the connecting portions 14 of at least the wire 18 (the conductive layer 8) are formed on the stress relieving layer. Besides, a polyimide resin may be used for the stress relieving layer but the material is not limited.

As shown in FIG. 1, the stress relieving layer may be formed in a plurality of projection 20. In this case, the wire 18 (the conductive layer 8) is formed to reach on each of the projections 20. That is, the connecting portion 14 may be formed on each of the projections 20. Accordingly, a plurality of bumps having a resin as a core can be formed on the surface of the semiconductor device 6. That is, the stress relieving layer formed as the projections 20 and the connecting portions 14 formed on the surface thereof can form resin bumps having almost the same function as a metal bump. Furthermore, the resin bumps can relax the stress concentrating on a connecting part of other members (other semiconductor chips, a wafer or a circuit board) by the stress relieving layer to be cores. Additionally, the topology of the projection 20 is not limited. However, it may be formed into a frustum of a pyramid or a cone.

Alternatively, as described later, the stress relieving layer may be formed as a plurality of recessed portions. In this case, the wire 18 (the conductive layer 8) is formed so as to reach on each of the recessed portions. For example, two or more of the projections are arranged to form an area therebetween and the recessed portion may be formed in the area. The connecting portion 14 may be formed on each of the recessed portions. Specifically, the connecting portion 14 is formed inside the recessed portions. Forming the recessed portions allows a bump (including the resin bump) having a projection shape, for example, to enter the inside thereof and the contact area of the electrical connecting portions can be made greater.

Additionally, the topology of the recessed portion is not limited as long as the contact area of the connecting portions is made greater.

As shown in FIGS. 1 and 2, the external terminal 24 may be disposed on the connecting portion 14. The external terminal 24 may be a solder ball, which comprises a solder material formed in a ball shape (a projection shape). The connecting potion 14 configures a seating by forming the external terminal 24 thereon. The external terminal 24 can join the semiconductor chip 6 to other members (other semiconductor chips, a wafer or a circuit board) excellently.

Additionally, the external terminal 24 such as a solder ball is not needed necessarily; a semiconductor module may be configured by mounting the semiconductor device on a substrate (an interposer). Furthermore, not forming the solder ball, a solder cream to be coated on the motherboard side when mounting a motherboard is utilized and the electrical connection may be intended with the surface tension at the time of melting.

Moreover, in the area other than the connecting portions 14, a solder resist layer 26 is formed. The solder resist layer 26 is to serve as an antioxidant layer or a protective film when finally completed as the semiconductor device, or further a protective film for improving moisture-proof.

Next, a method of fabricating a semiconductor device 1 as set forth will be described with reference to the process drawings of FIGS. 3A to 1C.

Figure 3A:
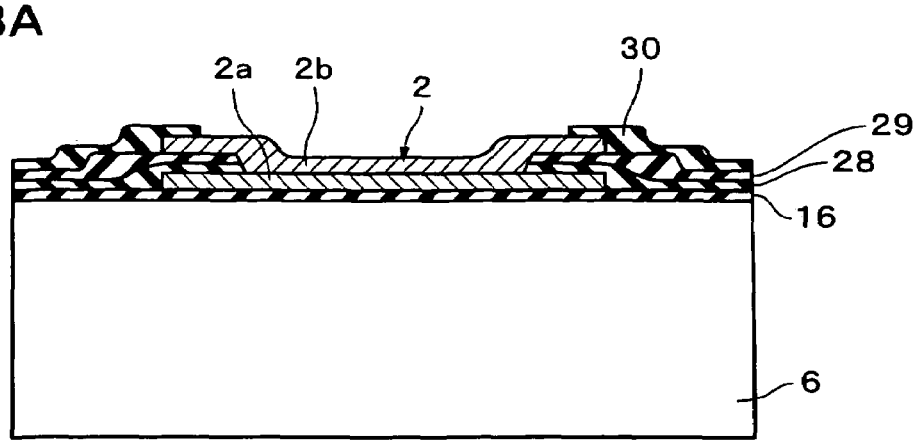
FIGS. 3A to 3C are illustrative of the method of fabricating a semiconductor device according to the first embodiment of the present invention.

As shown in FIG. 3A, the semiconductor chip 6 is formed with the insulating film 16 on the surface thereof and an under layer part 2a of the electrode 2 is formed on the insulating film 16. Then, insulating films 28 and 29 are deposited on the end part of the under layer part 2a and an upper layer part 2b of the electrode 2 is formed to reach the top of the insulating film 29. In addition, a passivation film 30 is formed to cover the end part of the electrode 2, avoiding the center part thereof. The passivation film 30 can be formed of $SiO_2$, SiN or a polyimide resin.

Figure 3B:
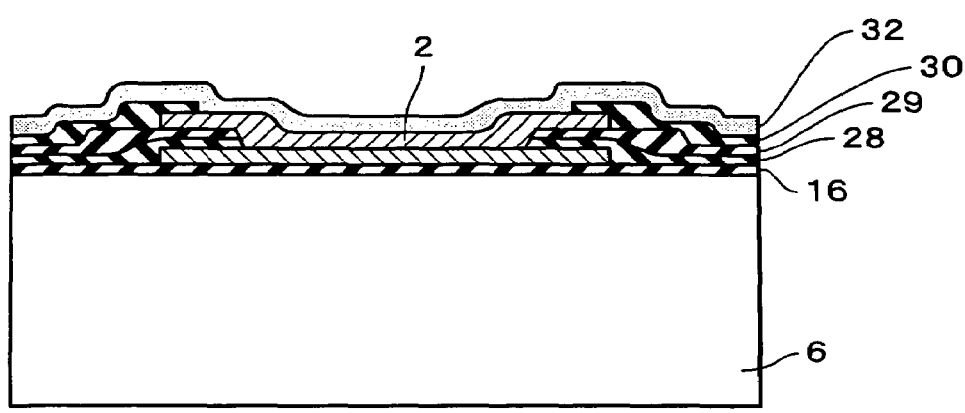

As shown in FIG. 3B, a resist 32 is formed on the active side of the semiconductor device 6, i.e. the surface where the electrode 2 is formed, covering the electrode 2. As a method of forming the resist 32, the spin coating method, the dipping method, the spray coating method can be used. The resist 32 covers the portion that is not etched in the etching process described later; it may be any of a photoresist, an electron beam resist or an X-ray resist and may be positive or negative. The resist 32 used in the embodiment is a positive potoresist. The resist 32 is pre-baked to remove a solvent for not attaching to other members after coating.

Figure 3C:
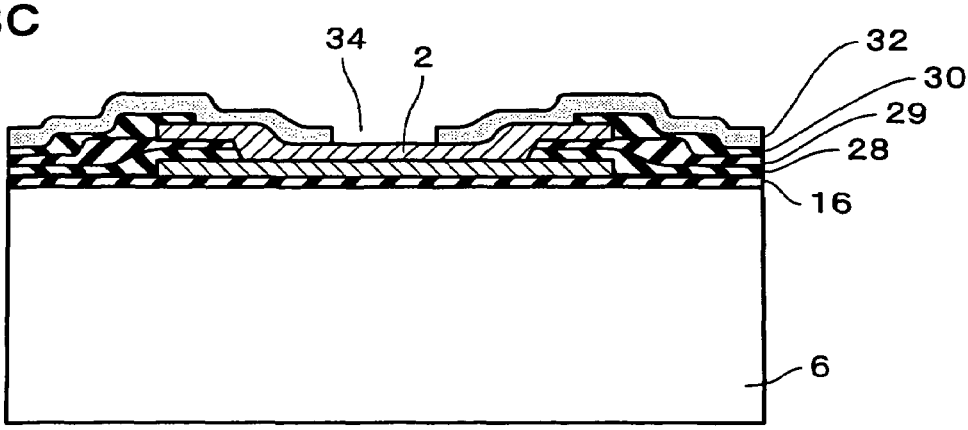

Subsequently, as shown in FIG. 3C, the resist 32 is patterned. Specifically, a mask, not shown, is placed on the resist 32 to irradiate energy. The energy differs from the properties of the resist 32, any one of a light, an electron beam or an X-ray. In the embodiment, the photoresist 32 is used for exposure. The shape of the mask is determined according to a patterning shape; it will be an inverse shape depending on the resist 32 being positive or negative.

After exposure, the resist 32 is developed and post-baked. The patterned resist 32 is formed with an opening 34 for exposing the center part of the electrode 2.

Figure 4A:
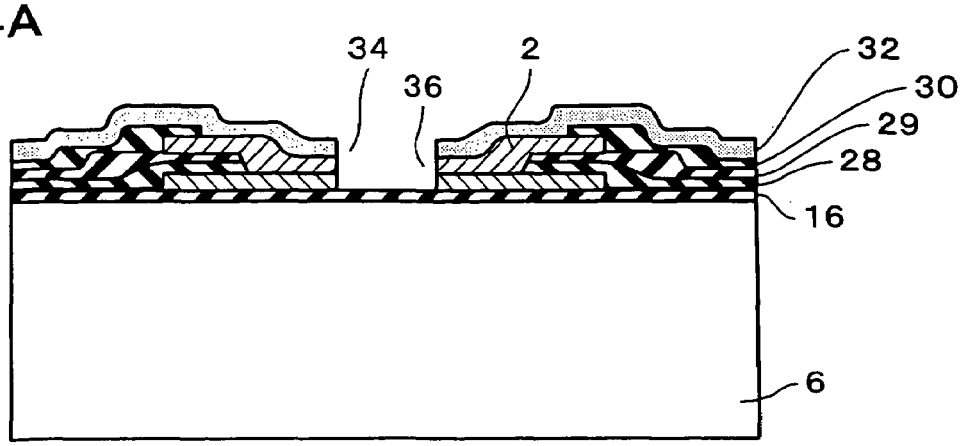
FIGS. 4A to 4C are illustrative of the method of fabricating a semiconductor device according to the first embodiment of the present invention.

As shown in FIG. 4A, the center part of the electrode 2 that has been exposed by the opening 34 of the resist 32 is etched. Dry etching is preferably adapted for etching. Dry etching may be the reactive ion etching (RIE). Additionally, wet etching may be adapted as etching.

Figure 4B:
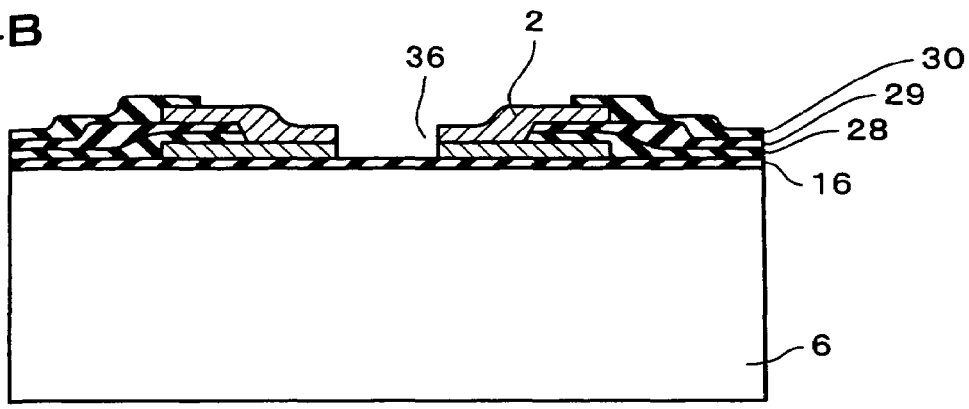

In this manner, as shown in FIG. 4B, a hole 36 is formed in the center part (the portion except the end part) of the electrode 2. The hole 36 is formed at the position to be the aforethe through hole 4 described in FIGS. 1 and 2. Specifically, the hole 36 is formed to have a size almost the same as the opening end part of the through hole 4 or greater for communicating with the through hole 4.

Figure 4C:
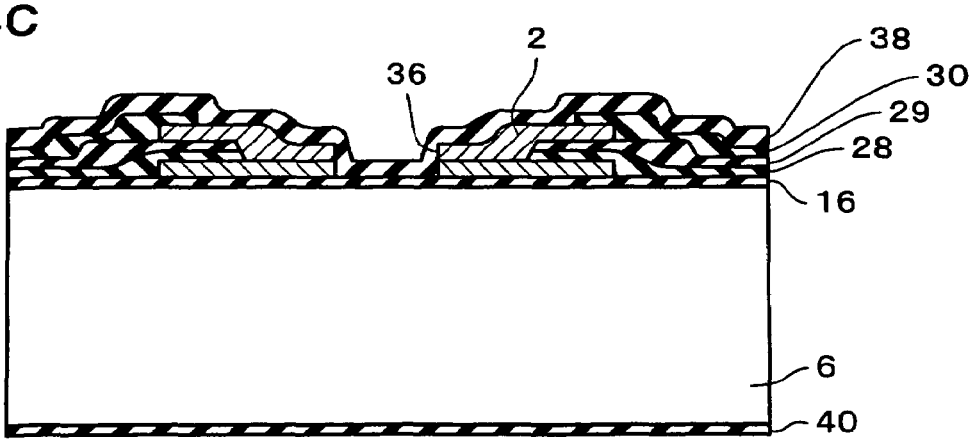

Then, after the resist 32 is removed, as shown in FIG. 4C, insulating films 38 and 40 are formed on the side (the active side) where the electrode 2 of the semiconductor device 6 and the opposite aide thereof (the non-active side). The insulating films 38 and 40 may be a silicon oxide film or a nitride film, which can be formed by the chemical vapor deposition (CVD). The insulating film 38 on the active side covers the electrode 2 and the passivation film 30. Since the electrode 2 is formed with the hole 36, the insulating film 38 covers inside the hole 36 (the inner wall surface and the exposed insulating film 16) as well.

Figure 5A:
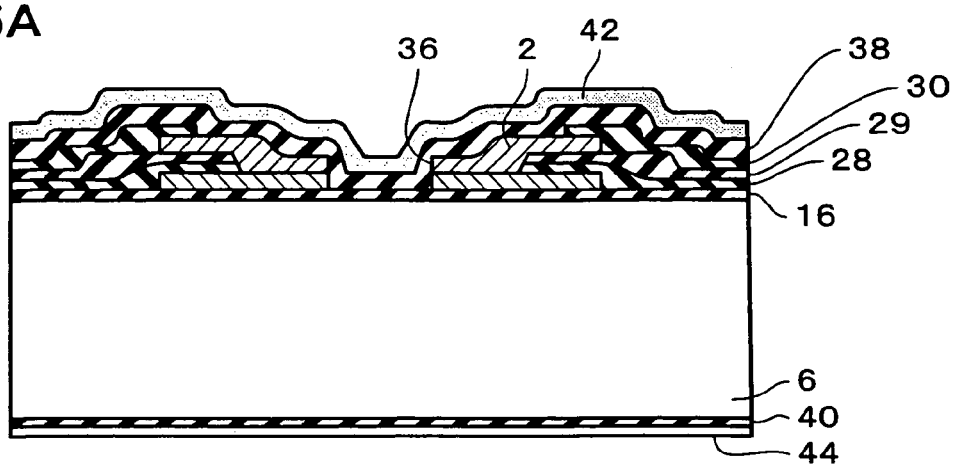
FIGS. 5A to 5C are illustrative of the method of fabricating a semiconductor device according to the first embodiment of the present invention.
Figure 5B:
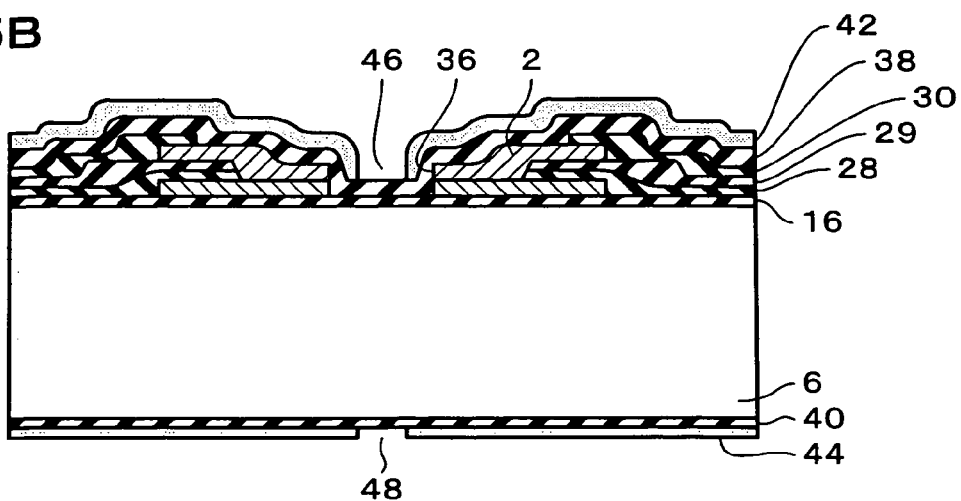

Subsequently, as shown in FIGS. 5A and 5B, resists 42 and 44 are formed on the active and the non-active sides of the semiconductor device 6. Then, these resists 42 and 44 are patterned to form openings 46 and 48 on the position to be the aforethe through hole 4 described in FIGS. 1 and 2. The opening 46 is formed on the inner side of the hole 36 of the electrode 2 so that the insulating film 38 exists between the hole 36 and the opening 46. Thus, the openings 46 and 48 expose a part of the insulating films 38 and 40. In addition, the formation and the patterning method of the resists 42 and 44 are relevant to the contents describing the resist 32 as set forth. It may be conducted that one of the resists 42 and 44 (the resist 42, for example) is formed (on the active side-of the semiconductor device 6, for example) to be pre-baked and then the other (the resist 44, for example) is formed and pre-baked.

Figure 5C:
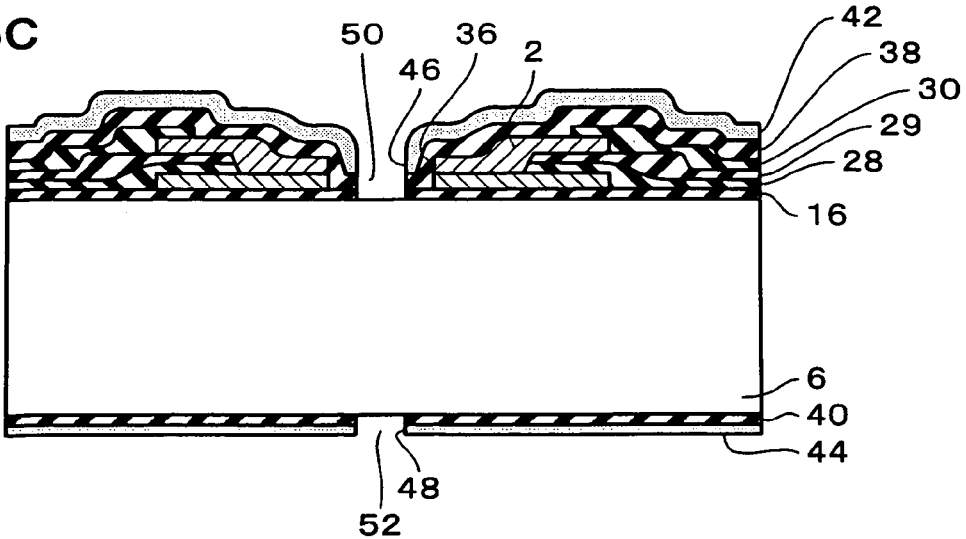

As shown in FIG. 5C, a hole 50 is formed inside the hole 36 of the electrode 2 in the insulating films 16 and 38 and a hole 52 is formed in the insulating film 40.

Figure 6A:
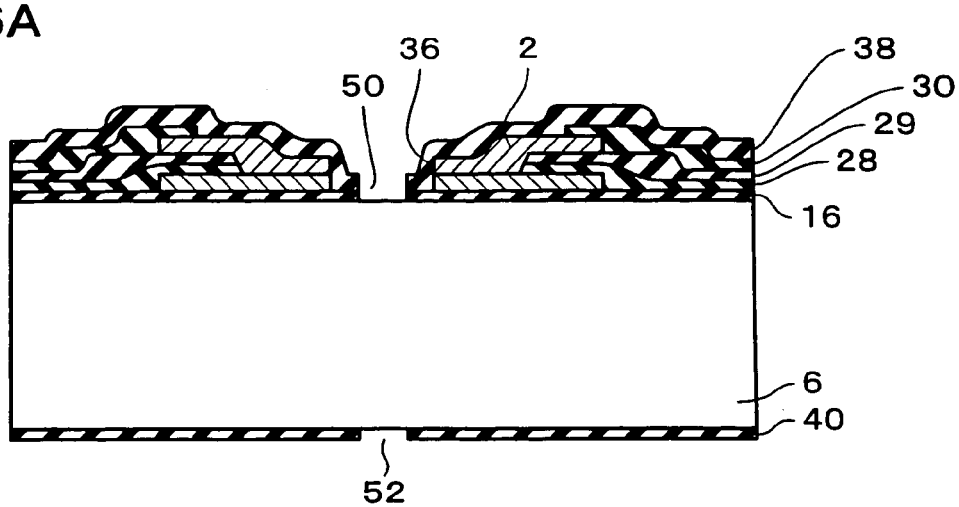
FIGS. 6A to 6C are illustrative of the method of fabricating a semiconductor device according to the first embodiment of the present invention.
Figure 6B:
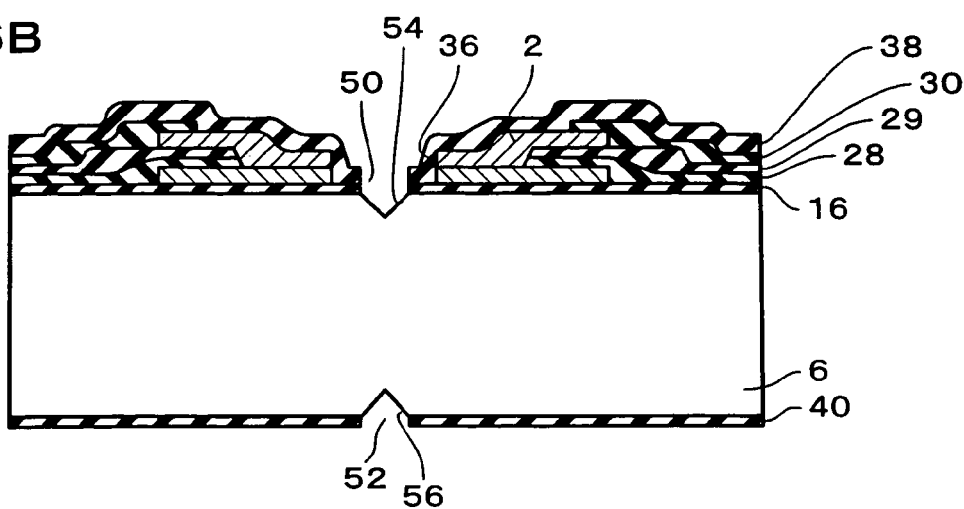

As shown in FIG. 6A, the resists 42 and 44 are removed. Then, as shown in FIG. 6B, portions exposed in the holes 50 and 52 of the semiconductor chip 6 are etched. The portions to be etched are the portions where the integrated circuits are not formed, being formed of silicon. By this etching, depressions 54 and 56, which are visibly well recognized, are formed on the surfaces of the semiconductor chip 6. The topology of, the depressions 54 and 56 are not limited particularly; it may be added with a taper or may have a wall surface vertical to the surface. Applying wet etching is easy for etching but dry etching may be applicable. Depending on a kind of etching, the topology of the depressions 54 and 56 are determined.

Figure 6C:
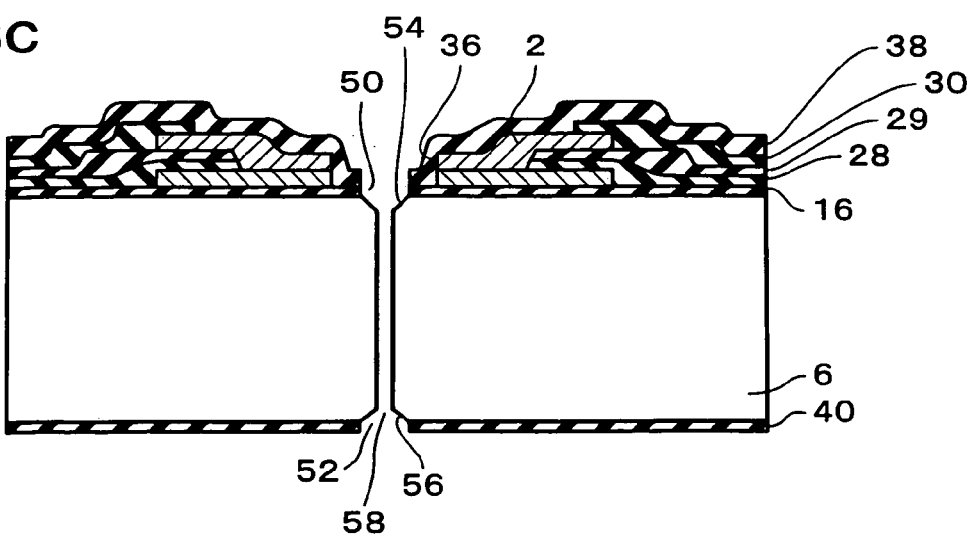

As shown in FIG. 6C, a small hole 58 (having a diameter of about 20 μm, for example) is formed in the semiconductor chip 6. The small hole 58 is formed in the center of the through hole 4 with a diameter smaller than the aforementioned through hole 4 described in FIGS. 1 and 2. For the formation of the small hole 58, a laser (a YAG laser or a $Co_2$ laser, for example) can be used. A laser beam can be irradiated by recognizing the position by the depressions 54 and 56 as set forth. The small hole 58 may be formed by irradiating the, laser beam only from one side of the semiconductor chip 6 or from both sides of the semiconductor chip 6 (in turn or simultaneously). When the laser is irradiated from both sides, the semiconductor chip 6 is less influenced.

Figure 7A:
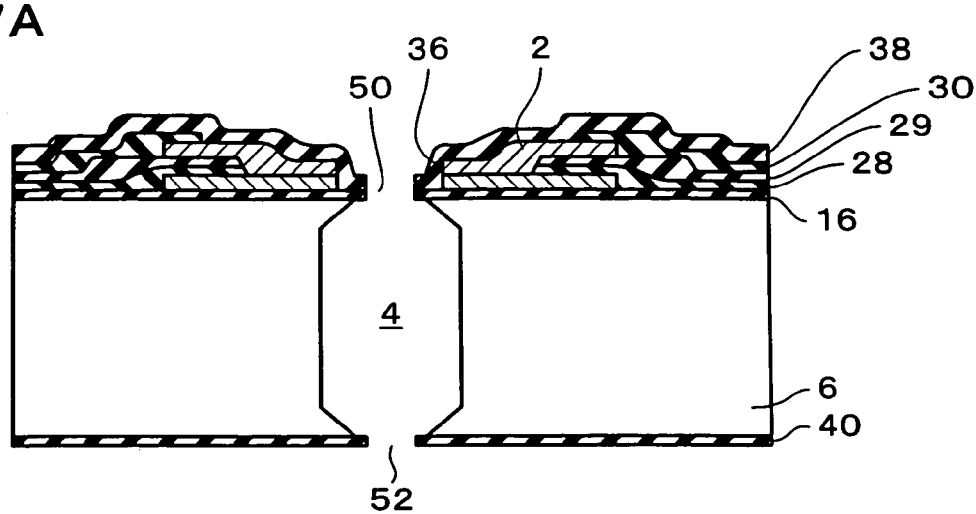
FIGS. 7A to 7C are illustrative of the method of fabricating a semiconductor device according to the first embodiment of the present invention.

As shown in FIG. 7A, the through hole 4 is formed in the semiconductor chip 6. The through hole 4 is formed by enlarging the small hole 58. For example, the inner wall surface of the small hole 58 may be etched by applying wet etching. For instance, an aqueous solution of hydrofluoric acid mixed with ammonium fluoride (buffered hydrofluoric acid) may be used as an etching liquid.

The through hole 4 may be formed into a shape having the opening end part and the middle part with a larger diameter than the opening end part (about 40 to 50 μm, for example). The diameter of the middle part of the through hole 4 is made larger as much as possible and thus the CVD or the electrodeless plating, described later, can be conducted easily. The middle part may be formed to have almost the same diameter in the entire part That is, the inner wall surface of the middle part of the through hole 4 may draw a linear line in the section through the center axis of the through hole 4. Alternatively, the middle part may be formed with a diameter that becomes larger as close to a midpoint of the semiconductor chip 6 in the thickness direction These shapes can be obtained by enlarging the small hole 58 by wet etching. According to these shapes, a reduction in strength of the semiconductor chip 6 due to forming the through hole 4 can be suppressed. The through hole 4 may have a taper part that connects the opening end part to the middle part. The taper part is also formed by enlarging the small hole 58 by wet etching. Alternatively, the through hole 4 may be formed into a straight shape so that the opening cross-section has almost the same diameter in the entire part in the axial direction.

Figure 7B:
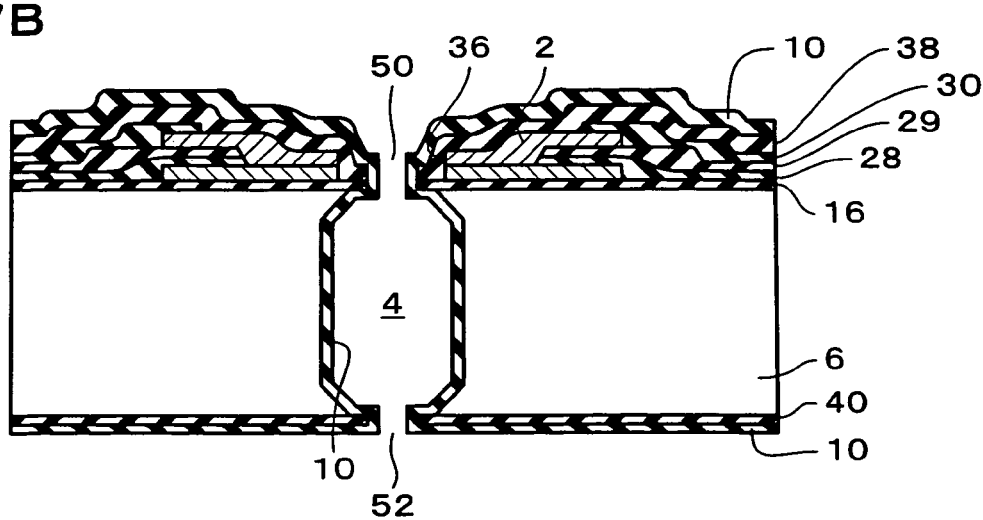

Next, as shown in FIG. 7B, the insulating film is formed at least on the inner wall surface of the through hole 4. For the formation of the insulating film 10, the CVD may be applied. The insulating film 10 may be formed in the area other than the inner wall surface of the through hole 4. For example, the insulating film 10 may be formed on the insulating films 38 and 40. However, in order to form the conductive layer 8 in the later process, the insulating film 10 is not to block the opening of the through hole 4.

The insulating film 10 may be formed of a resin. In this case, the resin may be coated on the area including the inner wall surface of the through hole 4. As the way to coat the resin, the spin coating method, the spray coating method or the combination of these can be applied. In the spin coating method, adjusting the viscosity of the resin to be dropped can form a uniform film on the inner wall surface of the through hole 4. Additionally, in the spray coating method, the resin can be coated on the through hole 4 by utilizing air jet or static electricity. Furthermore, the resin to be coated can be allowed to coat the inner wall surface of the through hole 4 easily by removing and drying the solvent in the resin.

Alternatively, the resin is buried inside the through hole 4 and thereby the insulating film 10 may be formed on the inner wall surface of the through hole 4. The resin may be disposed inside the through hole 4 using a dispenser. Then, a hole that penetrates through the resin inside the through hole 4 is formed with a diameter smaller than that of the through hole 4. That is, the through hole 4 is buried with the resin temporarily and then the through hole 4 is opened again. The hole penetrating through the resin may be formed by using the laser beam.

According to these processes, the insulating film 10 can be formed only by coating the resin. That is, the insulating film 10 can be formed with low costs for a short time without using a special device.

Figure 7C:
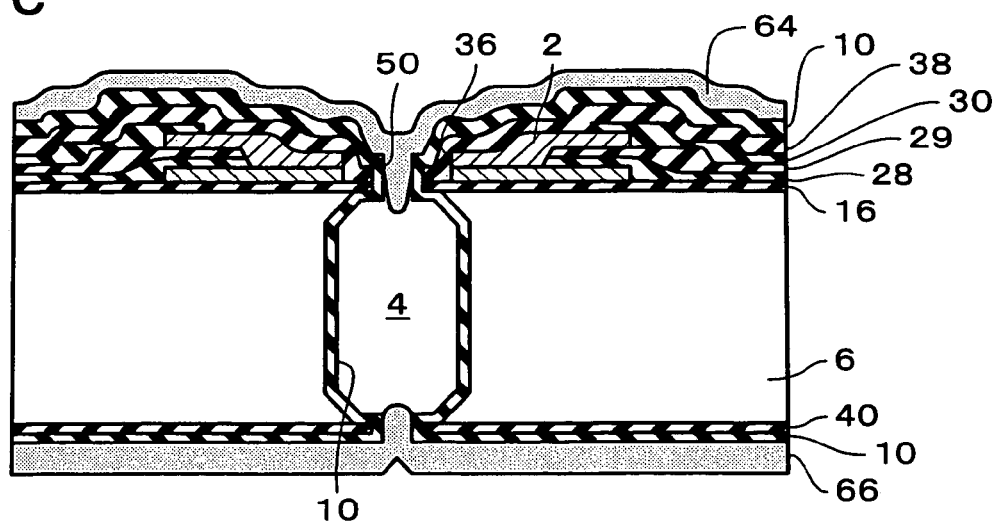
Figure 8A:
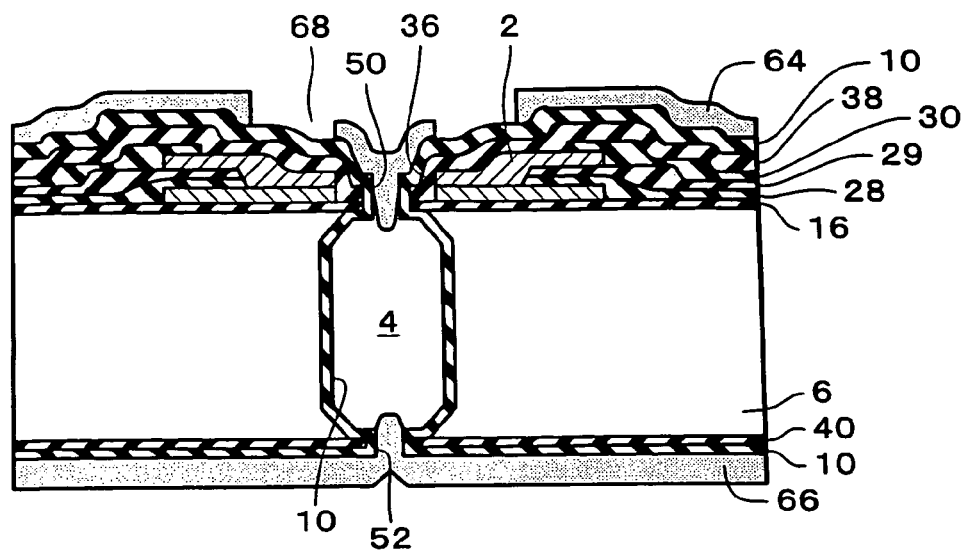
FIGS. 8A and 8B are illustrative of the method of fabricating a semiconductor device according to the first embodiment of the present invention.

Next, as shown in FIGS. 7C and 8A, a resist 64 is formed on the active side of the semiconductor chip 6 so as to block one opening of the through hole 4 in the semiconductor chip 6 and then the resist 64 is patterned to form an opening 68. In addition, when the resist 64 is formed, a resist 66 may be formed on the non-active side as well. Then, the resists 64 and 66 are pre-baked. The formation and the patterning method of the resists 64 and 66 can be applied to the contents described on the resist 32 as set forth. The opening 68 is formed on the upper part of at least a part of the electrode 2 whereas a part of the resist 64 is left on the upper part of the through hole 4. For example, the opening 68 is formed into a ring-like shape between the outer rim of a shape contained within the range of the electrode 2 and the inner rim of a shape covering at least the opening end part of the through hole 4. In addition, the ring-like shape referred here may be a rectangular ring or a circular ring. The opening 68 exposes a part of the insulating film 10.

Figure 8B:
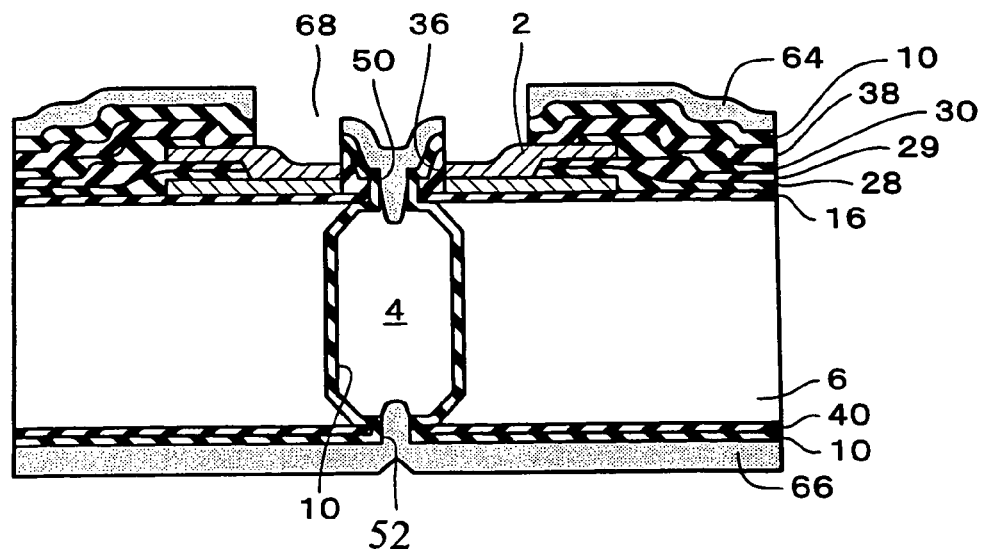

Then, as shown in FIG. 8B, using the patterned resist 64 as a mask, the insulating films 10 and 38 are etched to expose a part of the electrode 2. The part of the electrode 2 to be exposed here is a portion to aim the electrical connection and thus greater is preferable. After that, the resists 64 and 66 are removed.

Figure 9A:
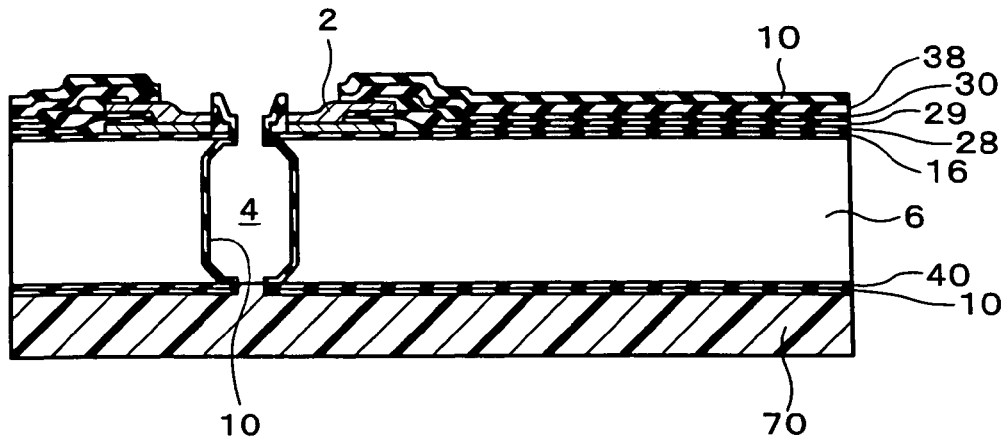
FIGS. 9A to 9C are illustrative of the method of fabricating a semiconductor device according to the first embodiment of the present invention.

As shown in FIG. 9A, the stress relieving layer 70 is formed on the top of the semiconductor chip 6. In the example shown in the drawing, the stress relieving layer 70 is formed on the surface opposed to the surface where the electrode 2 is formed in the semiconductor chip 6. The stress relieving layer 70 may be formed by coating a photosensitive polyimide resin (by "the spin coating method," for example). The stress relieving layer 70 may be formed to cover the entire surface of the semiconductor chip 6. The stress relieving layer 70 is preferably formed to have a thickness ranging within 1 to 100 μm, more preferably, about 10 μm. In addition, in the spin coating method, much of the polyimide resin is wasted and thus an apparatus extruding the polyimide resin in a belt shape by a pump may be used. As such, an apparatus, for example, the one disclosed in U.S. Pat. No. 4,696,885 may be used.

Figure 9B:
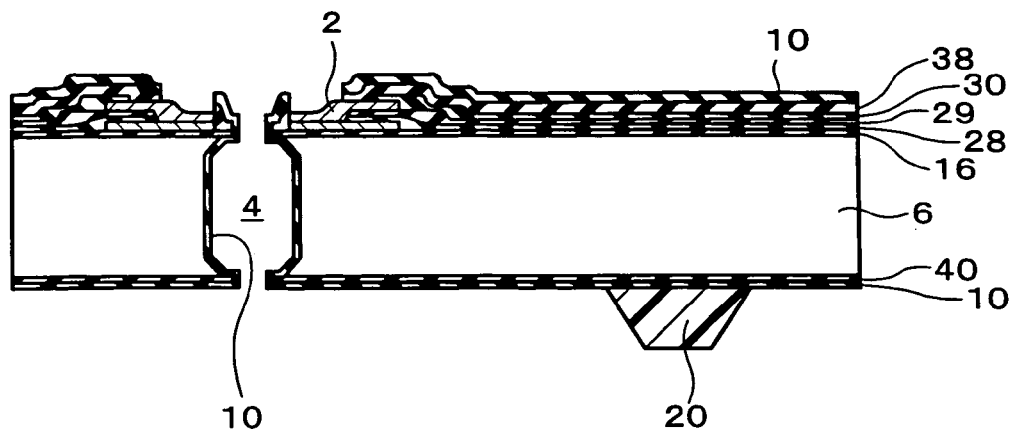

As shown in FIG. 9B, the stress relieving layer 70 is formed into a plurality of the projections 20. For example, the projections 20 may be formed by applying the photolithography technique with respect to a photosensitive resin. That is, the stress relieving layer 70 is exposed, developed and baked to remove the other portion, leaving the portion to be a seating for the wire, described later, i.e., the projections 20.

Alternatively, a non-photosensitive resin may be used as the stress relieving layer 70. For example, the stress relieving layer 70 is formed to cover the entire surface of the semiconductor chip 6 and then the projections 20 may be formed by etching. Alternatively, the projections 20 may be formed directly by screen-printing or the ink jet method. As a material for the stress relieving layer 70, for example, a silicon-denatured polyimide resin, an epoxy resin or a silicon-denatured epoxy resin can be used other than the polyimide resin. As the stress relieving layer 70, the material is preferably used that has a low Young's modulus when solidified ($1 \times 10^{10}$ Pa or under) and can serve as a role of stress relaxation.

Figure 9C:
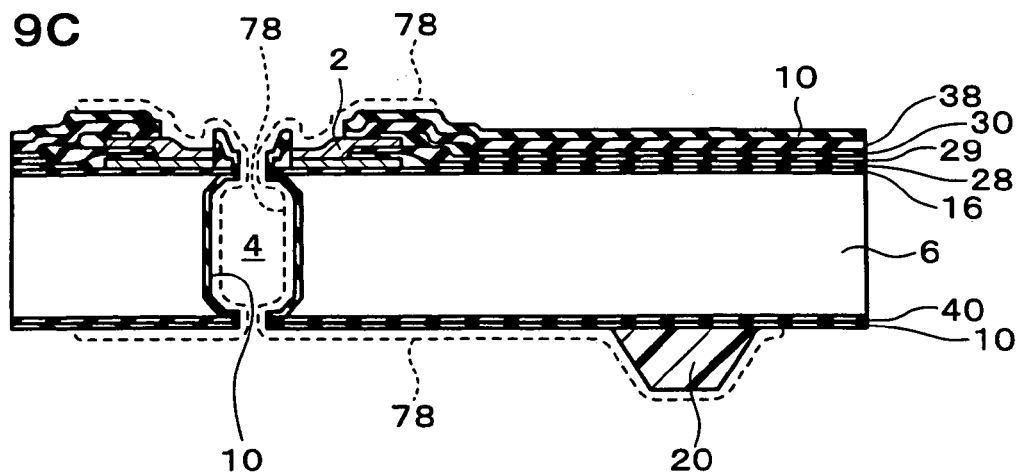

Next, the conductive layer 8 is formed in the semiconductor chip 6. For example, as shown in FIG. 9C, a catalyst 78 is disposed on the surface of the semiconductor chip 6 including the inner wall surface of the through hole 4 to reach on the projection 20. That is, the conductive layer 8 may be formed by electrodeless plating (autocatalyst plating, for example).

First, a resist (not shown) is formed on both the active and the non-active sides of the semiconductor chip 6, avoiding a predetermined area where the catalyst 78 will be formed. For example, the resist on the active and the non-active sides of the semiconductor chip 6 is patterned and then an opening part communicating with the through hole 4 and a wiring pattern continuing to the opening part may be formed. The opening part on the active side in the resist exposes the electrode 2. The resist on the non-active side is formed on the area having a great step and thus a product already formed into a film-like shape (a dry film) is preferably used. Additionally, the resist is patterned and then pre-baled.

Next, the catalyst for electrodeless plating is provided on the area exposed out of the resist from the through hole 4 to the exposed portion of the electrode 2. Here, palladium is used as the catalyst. As a method of forming the catalyst, for example, the semiconductor chip 6 may be dipped into a mixed solution containing palladium and tin and then treated with acid such as hydrochloric acid. Thereby, only palladium may be disposed. Alternatively, the semiconductor chip 6 is dipped into a solution of tin chloride to adsorb a tin ion (a reducing agent). Then, the semiconductor chip 6 is dipped into a solution of palladium chloride, a palladium ion is reduced from the tin ion (the reducing agent) and a palladium nucleus (a catalyst) may be precipitated.

Additionally, when the semiconductor chip 6 is dipped into a predetermined solution to conduct electrodeless plating, the resist is preferably formed to cover the whole except a predetermined area, i.e., to reach the side surface of the semiconductor chip 6. Thereby, the electrical change between the electrodes in the semiconductor chip 6 in the solution can be prevented. That is, a treatment such as the metal precipitation by electrodeless plating can be uniformed. Furthermore, because of the same reason, lights are preferably shielded while the semiconductor chip 6 is dipped into the solutions.

Alternatively, the catalyst may be provided directly by the ink jet method. According to the ink jet method, applying a technique developed for an ink jet printer can economically provide ink at high speed with no waste. An ink jet head such as a piezo jet type which has been commercialized for the ink jet printer using a piezo-electric element or a bubble jet type which uses an electrothermal conversion product as an energy generating element can be used. The extrusion area and the extrusion pattern can be set arbitrarily. Thereby, the conductive layer 8 can be formed without conducting the resist patterning process and the resist removing process, or without conducting the etching process when a metal layer is formed on the entire surface.

Next, the resist on the active and the non-active sides of the semiconductor chip 6 is removed. Removing the resist can provide the catalyst only on the area where the conductive layer a is desired to form. When removing the resist, an ultraviolet ray may be irradiated or the resist may be removed by dipping into an alkalescent solution. Thereby, the resist can be removed easily and surely.

In addition, other than the example that the catalyst 7B is provided after the aforementioned resist has been disposed, for example, the catalyst 78 is provided on the entire surface of the semiconductor chip 6 and then the resist is disposed except the area where the conductive layer 8 is desired to form. Consequently, the catalyst 78 may be exposed on the area to form the conductive layer 8. In this case, the resist is removed after the step of forming the conductive layer 8 is finished.

Next, as shown in FIG. 1A, the conductive layer 8 is formed on the area where the catalyst 78 is exposed by electrodeless plating. In the conductive layer 8, a portion formed in the area extending from the opening end part of the through hole 4 on the surface of the semiconductor chip 6 configures the wire 18. Additionally, the catalyst 78 is provided on the inner wall surface of the through hole 4 (in the example of FIG. 9C, the surface of the insulating film 10) and the active and the non-active sides of the semiconductor chip 6. Therefore, the conductive layer 8 is formed continuously from the active side to the non-active side of the semiconductor chip 6 through the through hole 4. Furthermore, the conductive layer a is deposited on the electrode 2.

As a material for the conductive layer 8, any one of Ni, Au, Ni+Au, Cu, Ni+Cu or Ni+Au+Cu can be used. For example, a copper plating solution is used to reduce a copper ion in the solution as palladium that is the catalyst 78 is a nucleus for precipitating copper (the conductive layer 8). In addition, as a conductive material for forming the conductive layer 8, a plurality of different kinds of metals (Ni+Cu or Ni+Au+Cu, for example) may be used. Thereby, the conductive layer 8 may be formed of multiple layers.

For electrodeless plating, a solution of alkalescent copper plating may be used. As alkalescent (near pH 9) copper plating, for example, PB-570 may be used that comprises PB-570MU, PB-570A, PB-570B, PB-570C and PB-570S, which are mixed (the name of the manufacturer: EBARA-UDYLITE CO. LTD.). Accordingly, the solution of copper plating is alkalescent and thus damage given to the electrodes 2 can be reduced, even when the electrodes 2 are made of aluminium.

Alternatively, when a conductive layer is formed on the surface of the electrode 2, not shown in the drawing, to protect the electrode 2, the use of the alkalescent solution is made possible. The conductive layer 8 may be a single layer or multiple layers. For example, the conductive layer 8 may be formed of two layers of nickel and gold. As a method of forming the conductive layer a with nickel, the method may be conducted in which a zincate treatment is applied to the top of the electrode 2 to substitute the surface of aluminium for zinc, the semiconductor chip 6 is then dipped into a solution of electrodeless nickel plating and nickel may be deposited via the substitution reaction of zinc with nickel. Alternatively, aluminium is dipped into a solution of palladium that is selectively adsorbed only on aluminium, it is then dipped into the solution of electrodeless nickel plating and a nickel film may be precipitated as palladium in a nucleus. Although the conductive layer 8 may be formed of only nickel, the chip is further dipped into a solution of electrodeless gold plating and a gold film may be formed further on the nickel surface. Forming the gold film can further secure the electrical connection to the conductive layer 8.

All the examples as described above are the methods for forming the conductive layer 8 using the wet method (plating), however, methods using the dry method (sputtering) previously conducted as the other forming method or methods combining the dry method with the wet method may be adopted. In addition, the conductive layer 8 may be formed by electroplating.

Furthermore, the electrical connecting portions 14 that are electrically conducted to the electrode 2 may be formed. As shown in the drawing, a part of the conductive layer 8 (the wire 18) may be formed as the connecting portions 14. In this case, the conductive layer 8 is preferably formed to be thicker (approximately 5 μm or greater) to form the connecting portions 14.

The processes having been described so far form the conductive layer 8 and a part of the conductive layer 8 forms the wire 18 on the non-active side. The far end of the wire 18 covers the surface of the projection 20 formed of a resin such as polyimide and this portion is to he the connecting portion 14 for forming the solder ball.

Figure 10A:
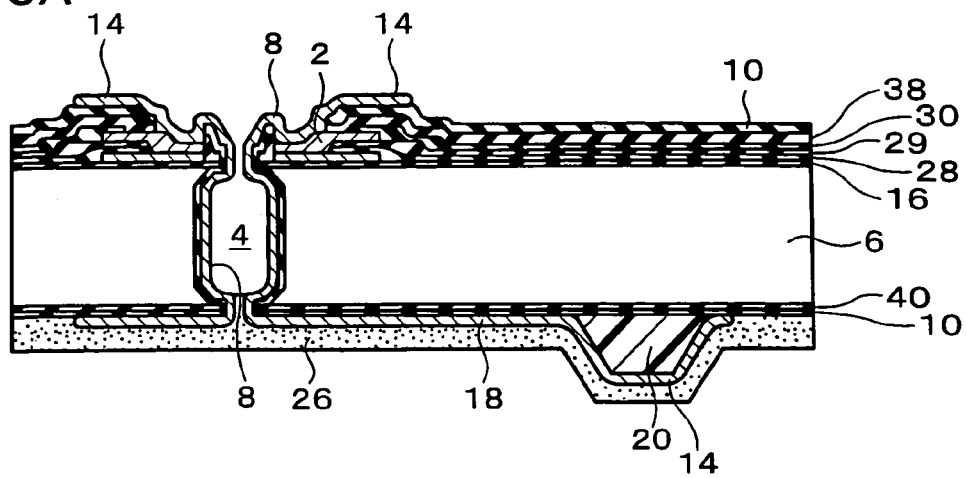
FIGS. 10A to 10C are illustrative of the method of fabricating a semiconductor device according to the first embodiment of the present invention.
Figure 10B:
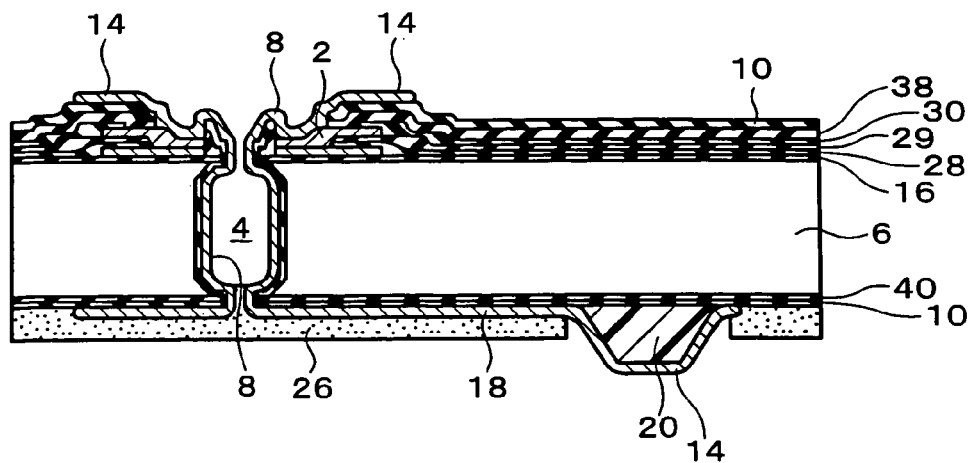

Moreover, as shown in the drawing, the solder resist layer 26 is preferably formed on the semiconductor chip 6. For example, the photosensitive solder resist layer 26 is formed to cover the entire surface of the semiconductor chip 6. Then, the solder resist layer 26 is exposed, developed and baked to remove the area covering the connecting portion 14 in the solder resist layer 26, as shown in FIG. 10B. The solder resist layer 26 is preferably disposed to cover at least the wire 18 (a part of the conductive layer 8). In this manner, the remaining solder resist layer 26 serves as the antioxidant layer or the protective film when finally fabricating a semiconductor device, or further the protective layer for improving moisture-proof.

Figure 10C:
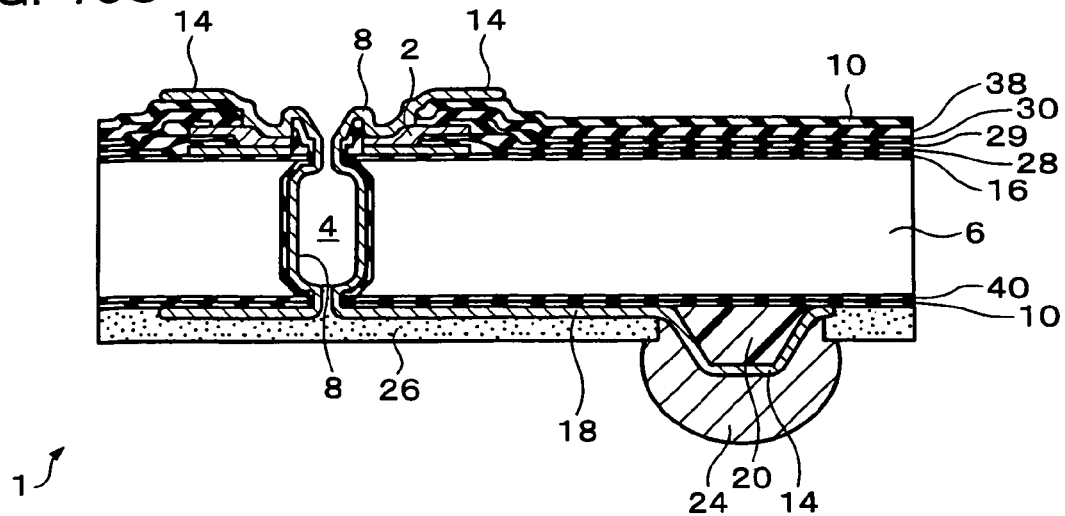

As shown in FIG. 10C, the external terminal 24 may be disposed on the connecting portion 14. The example shown in the drawing, the external terminal 24 is formed on the connecting portion 14 disposed on the projection 20 (the stress relieving layer 70). The external terminal 24 maybe the solder ball. For the formation of the external terminal 24, the solder to be the solder ball is formed in a thick layer on the connecting portion 14. The thickness of the solder is determined by the amount of the solder corresponding to the ball diameter that is required at the subsequent formation of the solder ball. The solder layer is formed by electroplating or printing. After that, a ball more than a hemisphere is shaped by at back. Here, wet back is termed that a solder material is formed at the position where the external terminal 24 is formed and then the product is ref loved to form approximately a hemispheric bump.

In addition, the solder resist layer 26 is used as a mask and the external terminal 24 may be formed without newly providing a mask. Thereby, the process can be simplified.

As described above, the semiconductor device 1 shown in FIGS. 1 and 2 is obtained. Then, according to the semiconductor device 1 fabricated in this manner, the projection 20 relaxes the stress due to the difference of the thermal expansion coefficient between the circuit board and the semiconductor chip 6. And, mounting the semiconductor chip 6 on the non-active side to the circuit board can eliminate damage to the active side opposed thereto when mounting. Therefore, to say nothing of the semiconductor chip 6, the reliability of the circuit board mounted with such a semiconductor chip 6 is improved.

In the method of fabricating a semiconductor device as described above, the semiconductor device 6 has been exemplified for description, however, it is similar to replace the semiconductor device 6 with the semiconductor wafer. In this case, almost all the steps can be completed in the wafer process. In other words, the step of forming the external terminal connected to the mounting board can be conducted in the wafer process. Thus, the orthodox packaging process is not necessarily conducted, that is, the process in which separate semiconductor chips are handled and the inner lead bonding process or the external terminal forming process is performed to the separate semiconductor chips.

According to the embodiment, forming the conductive layer 8 in the through hole 4 intends the electrical connection of one side to the other side of the semiconductor element (a semiconductor chip or a semiconductor wafer). Accordingly, a solid conductor is not formed by filling a melting material in the through hole 4 previously. Thus, a problem such as the generation of voids does not arise and the highly reliable electrical connection can be secured.

Furthermore, forming the conductive layer 8 to be a wire on the surface of the semiconductor element and thereby the pitch between the connecting portions 14 can be converted. That is, there is advantage to widen a degree of freedom in connection to the other members. Moreover, the stress relieving layer 70 (the projection 20) is formed on the semiconductor element, the connecting portion 14 (the conductive layer 8) and the external terminal 24 are formed thereon and thus the stress applied to the external terminal 24 can be relaxed by the stress relieving layer 70 (the projection 20). In addition, in the embodiment, since the semiconductor device can be fabricated to the form of the semiconductor package in a state of the semiconductor element, a substrate such as a film that is patterned provided with the external terminal beforehand may be eliminated.

Second Embodiment

Figure 11:
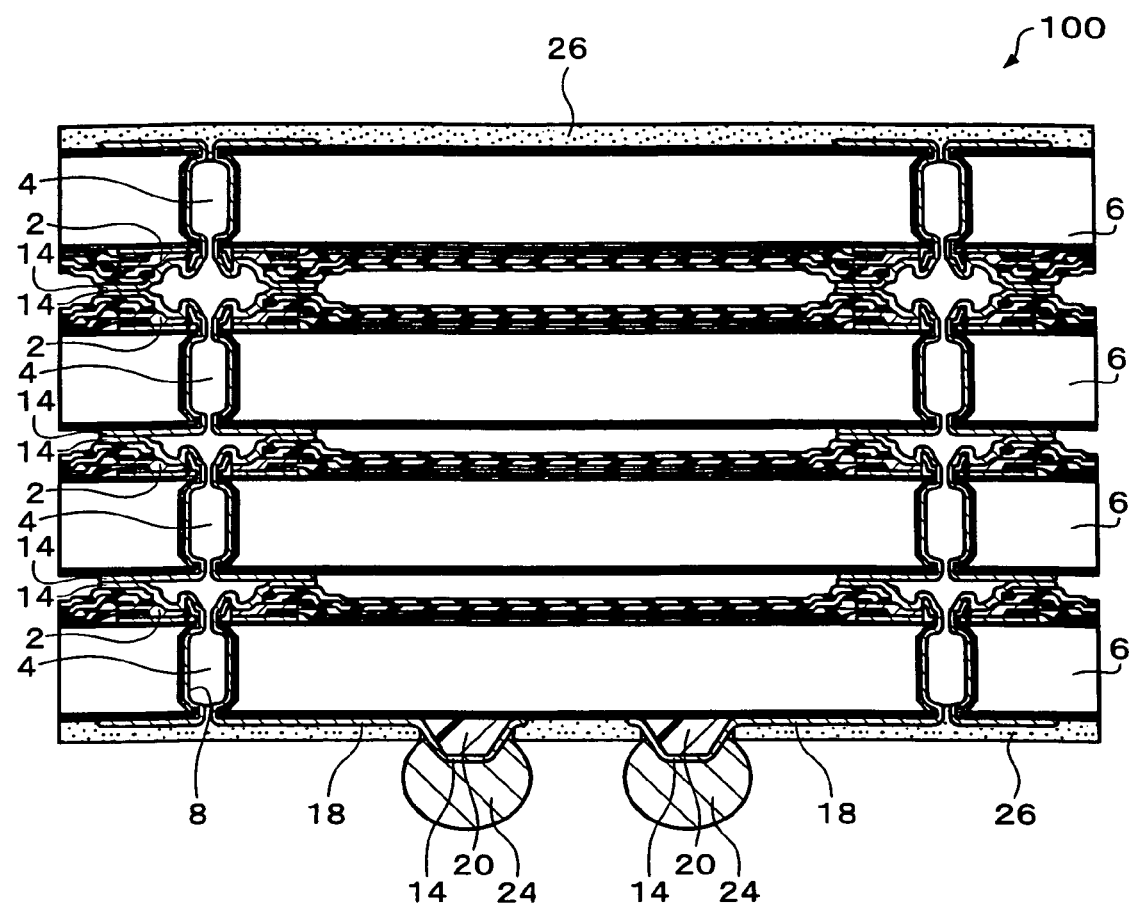
FIG. 11 is illustrative of the semiconductor device according to a second embodiment of the present invention.
Figure 12:
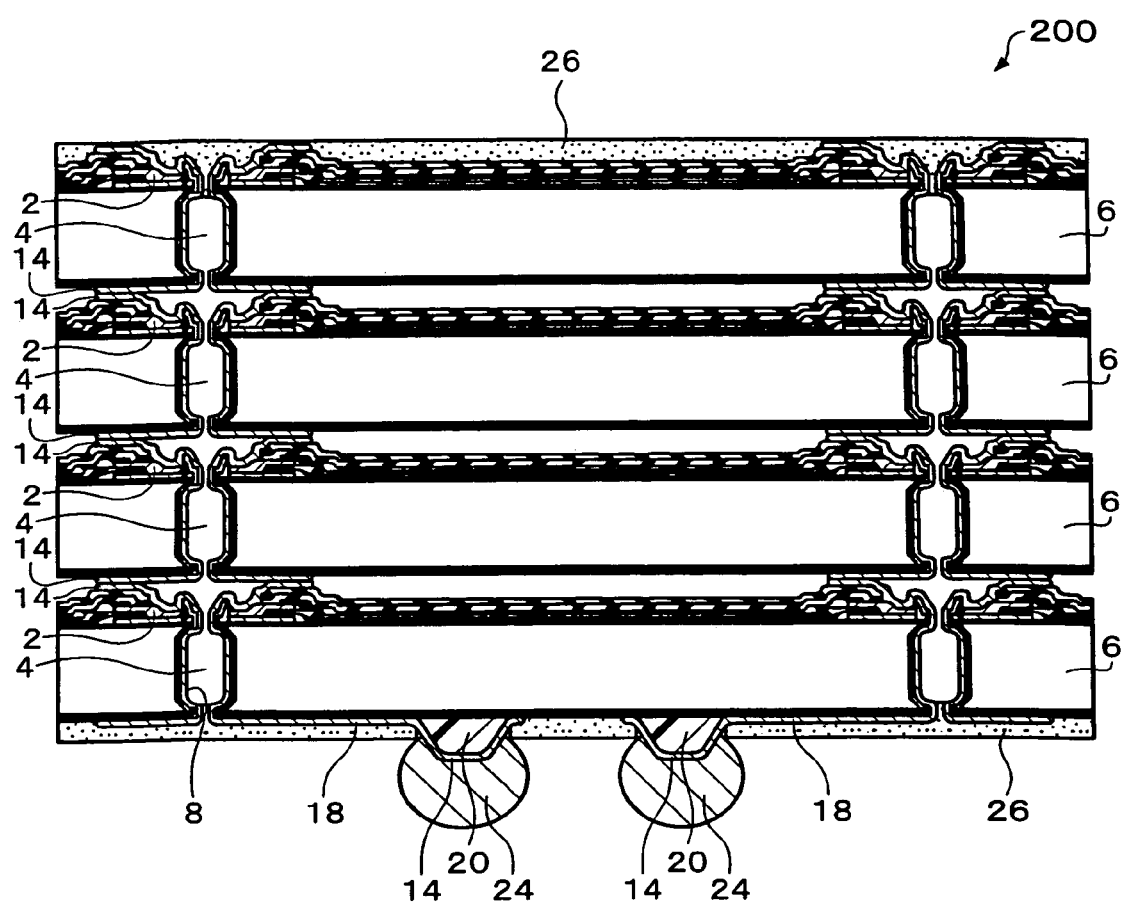
FIG. 12 is illustrative of the semiconductor device according to a modification of the second embodiment of the present invention.

FIG. 11 depicts a diagram illustrating a semiconductor device in the second embodiment. FIG. 12 depicts a diagram illustrating a semiconductor device in the modified example of the second embodiment. The embodiment described below can be applied to the contents described in the other embodiment as much as possible.

The semiconductor device described in this embodiment may be referred as a three-dimensional packaged type (stacked type) CSP (Chip Scale/Size Package). As shown in FIG. 11, a semiconductor device 100 includes a plurality of the semiconductor chips 6 having the electrodes 2 and formed with the through holes 4 and the conductive layers 8 formed on each of the semiconductor chips C.

The semiconductor chips 6 are stacked and arranged; a pair of the stacked semiconductor chips 6 is electrically connected by the conductive layer 8. The semiconductor device 100 may have at least one semiconductor device 1 fabricated by the steps described in the above-mentioned embodiment. In the example shown in the drawing, the semiconductor device 1 is disposed is, in the undermost layer of the semiconductor device 100. That is, the conductive layer 8 of the semiconductor chip 6 disposed in the undermost layer is formed as the wire 18 from the opening end part of the through hole 4 to the surface of the semiconductor chip 6. Then, the pitch between the connecting portions 14 formed on the semiconductor chip 6 in the undermost layer-is converted and thereby alignment with the circuit board can be performed easily.

Additionally, the semiconductor chip 6 disposed in the undermost layer is formed with the projections 20 and the external terminal 24 is formed on each of the projections 20 through the connecting portion 14 (the wire 18). Accordingly, the projection 20 (the stress relieving layer 70) can relax the stress due to the difference of the coefficient of thermal expansion between the semiconductor device 100 and the circuit board. Alternatively, instead of a plurality of the projections 20, the stress relieving layer 70 is left in a mass in the area where a plurality of the external terminals 24 are formed on the surface of the semiconductor chip 6 and the stress relieving layer 70 may, relax the stress applied to the semiconductor device 100. Accordingly, the area of the stress relieving layer 70 (a resin, for example) to be formed on the surface of the semiconductor chip 6 can be enlarged and thus the stress applied to the semiconductor device 200 can be relaxed efficiently by this enlarged area.

The semiconductor chip 6 in the undermost layer may be disposed facing the surface formed with the electrodes 2 to the other semiconductor chip 6. In this manner, when the semiconductor device 100 is mounted on the circuit board, the surface (the non-active side) opposite to the surface where the electrodes 2 are formed on the semiconductor chip 6 can be face to the circuit board. That is, damage to the active side on the opposite side can be eliminated when mounting. To say nothing of the semiconductor device 100, the reliability of the circuit board mounted with such a semiconductor device 100 cam be enhanced.

A pair of the stacked semiconductor chips 6 is electrically connected each other by the connecting portions 14 formed on the opening end parts of the through hole 4. Additionally, the orientation of the surface where the electrodes 2 in the semiconductor chips 6 subsequent to the semiconductor chip 6 in the undermost layer may be in the same direction as the semiconductor chip 6 in the undermost layer or may be disposed in the opposite direction.

In the example shown in FIG. 11, each of the second to the fourth semiconductor chips 6 from below has the same configuration; each of the connecting portions 14 on the non-active side are formed short so as to have the length overlapping with the electrical connecting portions 14 on the active side of the semiconductor chip to-be connected. Then, the second and the third semiconductor chips 6 from below are stacked in the same direction as the undermost semiconductor chip 6, i.e. the active side being up. Additionally, the semiconductor chip 6 in the uppermost layer is stacked as the active side is down. Furthermore, the top of the semiconductor device 100, that is, the non-active side of the uppermost semiconductor chip 6 is covered with the solder resist layer 26 and the under side of the semiconductor device 100, that is, the portion except the external terminals 24 on the non-active side of the undermost semiconductor chip 6 is covered with the similar solder resist layer 26 for protection.

And, the connecting portions 14 on the non-active sided of the second semiconductor chip 6 from below are overlapped on the electrical connecting portions 14 on the active side of the undermost semiconductor chip 6. The connecting portions 14 on the non-active side of the third semiconductor chi 6 from below are overlapped on the electrical connecting portions 14 on the active side of the second semiconductor chip 6. The electrical connecting portions 14 on the active side of the fourth semiconductor chip 6 from below are overlapped on the electrical connecting portions 14 on the active side of the third semiconductor chip 6. Joining the connecting portions 14 each other is performed by applying ultrasonic vibrations, or the ultrasonic vibrations and heat. When joined, vibrations or heat diffuse a material configuring the connecting portions 14 (the conductive layer 8) to form metal joining.

Alternatively, the modified example shown in FIG. 12, all the semiconductor chips 6 (four semiconductor chips 6) are stacked as the active side is up, that is, the active side is facing to the opposite side of the circuit board. In addition, on the surface side insulating film on the non-active side of the undermost semiconductor chip 6, the projections 20, the conductive layer 8 including the electric connecting portions 14 and the wire 18, the external terminals 24 and the solder resist layer 26 are formed by the steps as set forth.

Then, the electrical connecting portions 14 on the non-active side of the second semiconductor chip 6 from below are overlapped on the connecting portions 14 on the active side of the undermost semiconductor chip 6. The electrical connecting portions 14 on the non-active side of the third semiconductor chip 6 from below are overlapped on the connecting portions 14 on the active side of the second semiconductor chip 6. The electrical connecting portions 14 on the non-active side of the fourth semiconductor chip 6 from below are overlapped on the connecting portions 14 on the active side of the third semiconductor chip 6. Then, joining the connecting portions 14 each other may be metal joining.

Alternatively, the entire semiconductor chips 6 (four semiconductor chips 6) may be stacked to face the active side under, that is, in a state of facing to the circuit board side. The orientation of each of the semiconductor chips 6 is not limited by the description above.

Additionally, here, the electrical joining between each of the semiconductor chips 6 has been exemplified by the examples conducted by metal joining, however, the electrical joining may be conducted by a solder material such as solder, a conductive adhesive or a fluoridized treatment. Furthermore, the conductive adhesive may be a liquid or gel adhesive, or a sheet-like adhesive sheet.

A conductive material in the adhesive is composed of particles of the solder material or the solder, which are dispersed in the adhesive material. In this manner, when each: of the semiconductor chips is joined each other, these particles serve as a joining solder for enhancing joining properties more considerably.

Moreover, the adhesive may be an anisotropically conductive adhesive (ACA) where conductive particles are dispersed such as an anisotropically conductive film (ACF) or an anisotropically conductive paste (ACP). The anisotropically conductive adhesive is that the conductive particles (filler) are dispersed in a binder; a dispersant might be added. As the binder for the anisotropically conductive adhesive, a thermosetting adhesive is often used. In this case, the conductive particles are involved between the connecting portions 14 for intending the electrical connection.

In the stack-type semiconductor device as described above, the semiconductor chip has been exemplified for explanation, however, it is similar to replace the semiconductor chip with the semiconductor wafer. That is, the semiconductor device 100 may be fabricated by stacking a plurality of the semiconductor wafers, which have been processed by the same steps as the steps of fabricating the semiconductor chips in the respective layers, then electrically connecting the connecting portions to each other, and dicing them.

According to the embodiment, the small-sized semiconductor device having a stacked structure, which can be mounted on the circuit board easily, can be provided.

The method of fabricating a semiconductor device in the embodiment includes the step of stacking the semiconductors devices fabricated by the fabricating method as set forth to electrically connect the upper and the under semiconductor devices by the conductive layer 8.

Third Embodiment

Figure 13:
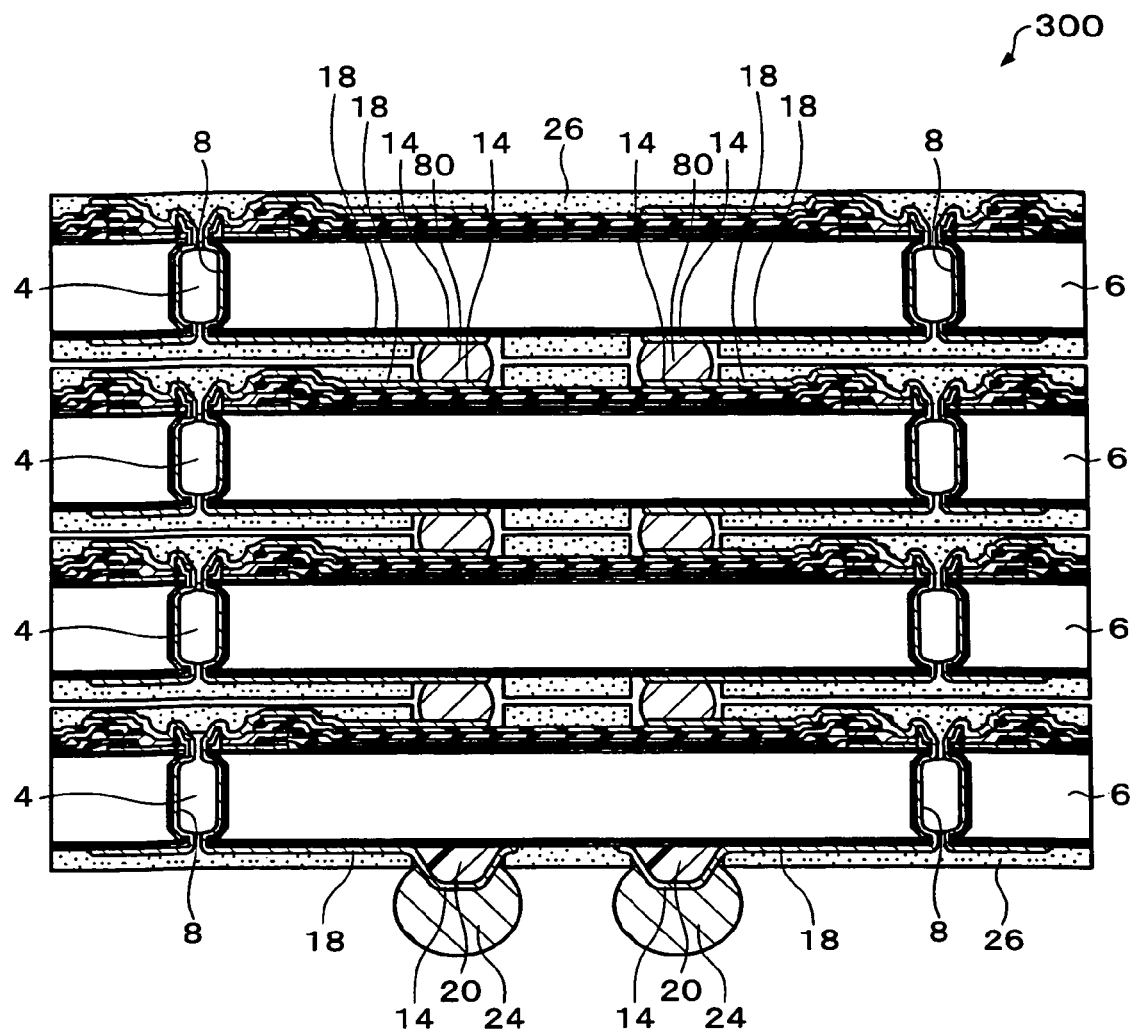
FIG. 13 is illustrative of the semiconductor device according to a third embodiment of the present invention.

FIG. 13 depicts a diagram illustrating a semiconductor device in the third embodiment. A semiconductor device 300 includes a plurality of the semiconductor chips 6 having the electrodes 2 and formed with the through holes 4 and the conductive layer 8 including the wire 18 formed on each of the semiconductor chips 6.

In this embodiment, not only the semiconductor chip 6 in the undermost layer but also the other semiconductor chips 6 have the pitch between the connecting portions 14 (the wire 18) converted. In detail, in a pair of the stacked semiconductor chips 6, the conductive layer 8 is further formed in the area extending from the opening end parts of the through hole 4 to configure the wire 18, which is routed in a predetermined form for intending to convert the pitch between the connecting portions 14. Thereby, electrically connecting a pair of the stacked semiconductor chips 6 is facilitated. That is, the pitch between the adjacent connecting portions 14 is wider than that between the adjacent electrodes 2 and thus each of the electrodes 2 is not short-circuited when a plurality of the semiconductor chips 6 are stacked. Therefore, the yields of the semiconductor device when fabricated are enhanced and the semiconductor device having a highly reliable stacked structure can be provided.

The connecting portions 14 in a pair of the stacked semiconductor chips 6 are preferably intended for the electrical connection of these by forming the projections. For example, as shown in the drawing, the connecting portions 14 may be joined by interposing metal bumps 80. The metal bumps 80 may be formed of a gold bump (including a gold plated bump) or a nickel bump, a solder material such as a solder or the combination of these. For the forming method thereof, the plating (electroplating or electrodeless plating) treatment, the sputtering, the metal foil etching or the solder reflowing are named. In addition, the semiconductor chip 6 preferably has the solder resist layer 26 formed particularly on the wire 18 (the conductive layer 8) except the connecting portions 14. Furthermore, the uppermost semiconductor chip 6 preferably has the entire top surface thereof covered with the solder resist layer 26.

Moreover, apart from the example shown in the drawing, the stress relieving layer may be formed between a pair of the stacked semiconductor chips 6. That is, the connecting portions 14 may be formed in the stress relieving layer. In this case, the stress relieving layer may be formed to spread two-dimensionally in the area to form a plurality of the connecting portions 14. In this embodiment. Even when the connecting portions 14 are formed on the stress relieving layer; 70 approximately flush having no projections, the metal bumps 80 can intend the electrical connection between the semiconductor chips 6.

FOURTH EMBODIMENT

Figure 14:
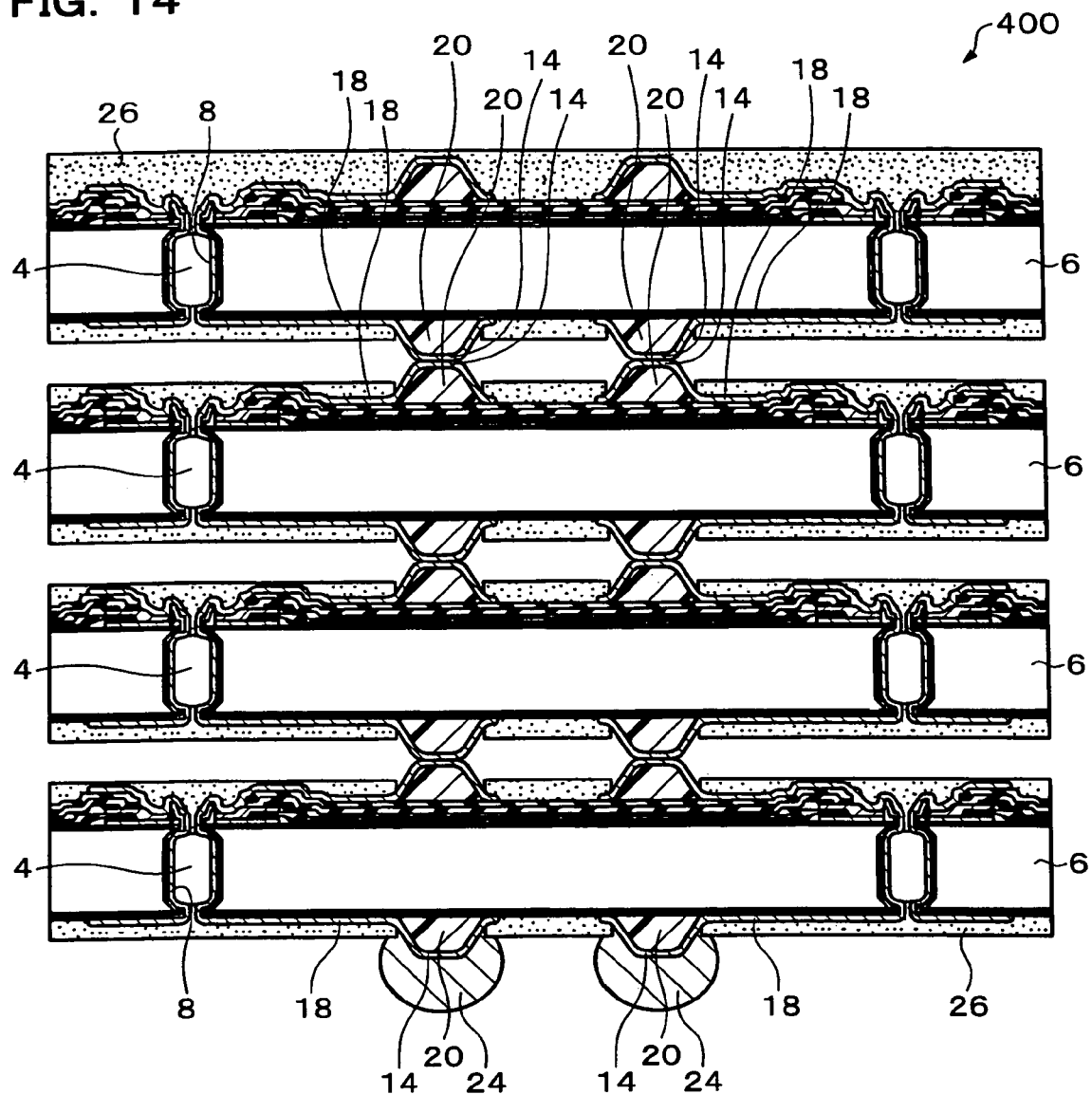
FIG. 14 is illustrative of the semiconductor device according to a fourth embodiment of the present invention.
Figure 15:
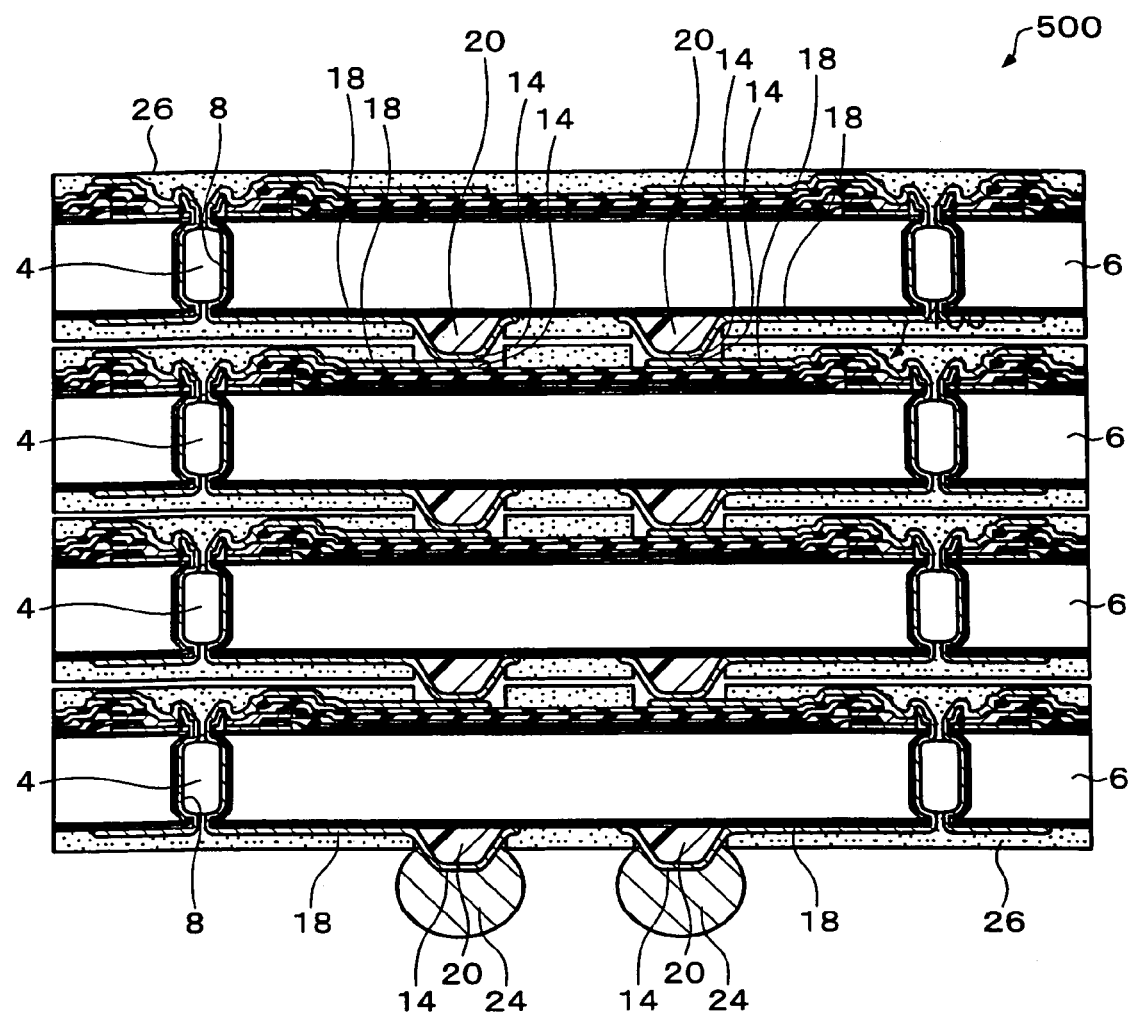
FIG. 15 is illustrative of the semiconductor device according to a second example of the fourth embodiment of the present invention.
Figure 16:
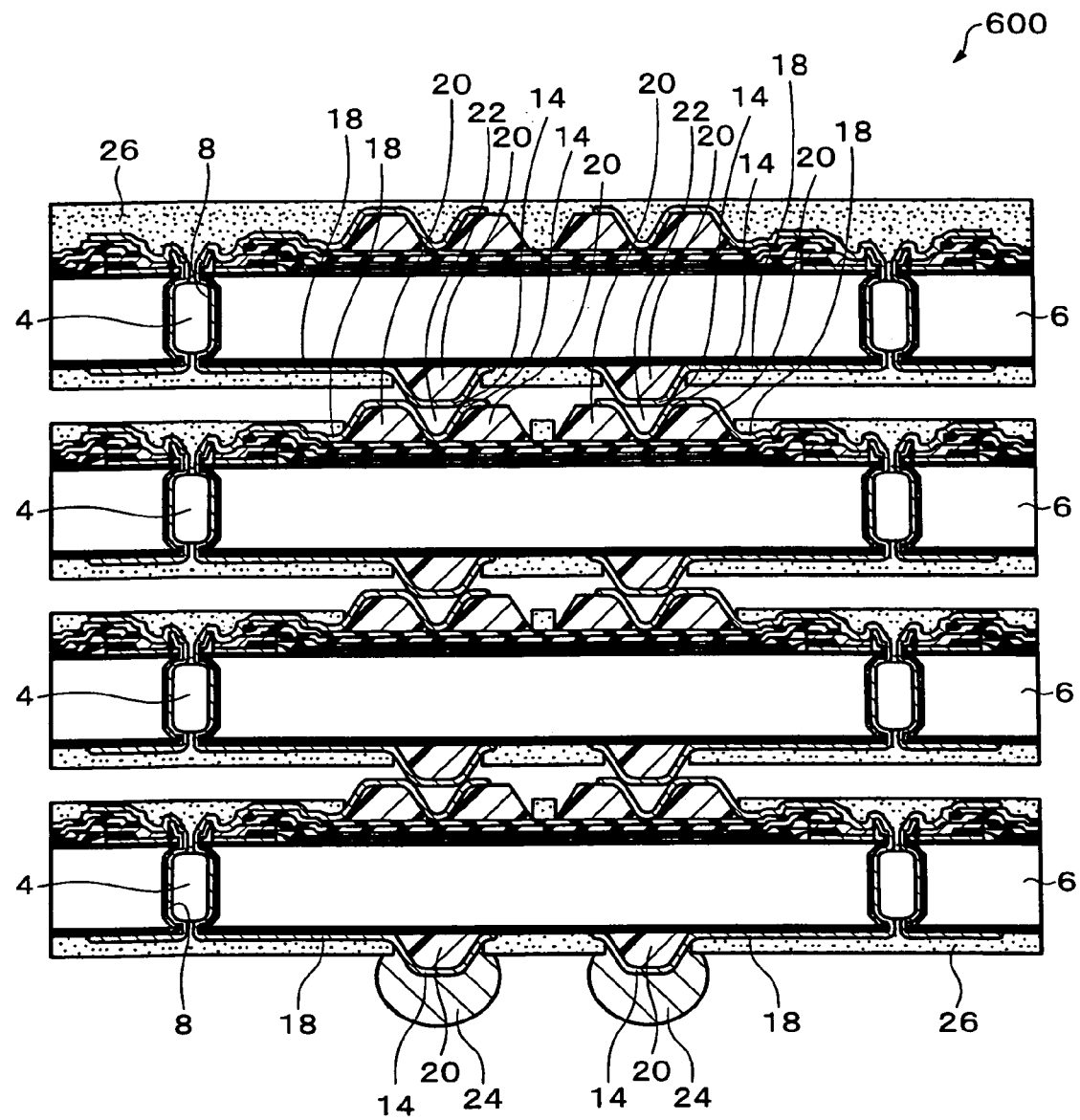
FIG. 16 is illustrative of the semiconductor device according to a third example of the fourth embodiment of the present invention.

FIGS. 14 to 16 depict diagrams illustrating a semiconductor device in the fourth embodiment. In this embodiment, the projections 20 are formed between a pair of the stacked semiconductor chips 6.

FIRST EXAMPLE

As shown in FIG. 14, a semiconductor chip 400 included a plurality of the semiconductor chips 6 having the electrodes 2 and formed with the through holes 4, the conductive layer 8 including the wires 18 formed on each of the semiconductor chips 6 and a plurality of the projections 20 formed on the surface of the semiconductor chip 6. Then, the projections 20 on a pair of the stacked semiconductor chips 6 are arranged to face each other.

The semiconductor chip 6 is formed with the projections 20 on both sides thereof. And, the connecting portions 14 are formed on the projections 20. Thereby, in a pair of the stacked semiconductor chips 6, a resin (the projections 20) can relax the stress concentrating on the connecting part of them in particular. Therefore, the reliability in connection of the semiconductor chips 6 can be enhanced.

Additionally, the resin is formed as the projections 20 and thereby the bump having the resin as a core can be formed. That is, the projections 20 are used instead of the aforethe metal bumps 80 and thus the connecting portions 14 can be electrically connected without newly forming bumps. Alternatively, a metal bump may further be formed on the connecting portions 14.

Furthermore, as shown in the drawing, the semiconductor chips 6 after the second semiconductor chip 6 from below may have the same form as the undermost semiconductor chip 6. That is, in the entire semiconductor chips 6, the connecting portion 14 may be formed on the projections 20. Thereby, the semiconductor chips 6 formed by the same process can be stacked so that the steps until the semiconductor device having the stacked structure is finally fabricated can be simplified.

Alternatively, apart from the example shown in the drawing, in the undermost semiconductor chip 6, the stress relieving layer to be formed on the side facing to the circuit board may be formed in the area spreading two-dimensionally. In this case, the stress relieving layer may be formed on approximately entire surface. Thereby, the stress caused by the difference of the coefficient of thermal expansion between the semiconductor device and the circuit board can be relaxed efficiently.

In addition, the electrical connection between the connecting portions 14 may be conducted by metal joining, joining by solder or a conductive adhesive.

SECOND EXAMPLE

FIG. 15 depicts a diagram illustrating a semiconductor device in the second example of this embodiment. A semiconductor chip 500 includes a plurality of the semiconductor chips 6 having the electrodes 2 and formed with the through holes 4, the conductive layer 8 including the wires 18 formed on each of the semiconductor chips 6 and a plurality of the projections 20 formed on the surface of the semiconductor chip 6.

The semiconductor chip 6 is formed with the projections. 20 on either side thereof. Then, a pair of the stacked semiconductor chips 6 is arranged to face the surface formed with the projections 20 in one semiconductor chip 6 to the surface opposed to the surface formed with the projections 20 in the other semiconductor chip 6. When the projections 20 are formed on either of a pair of the stacked semiconductor chips 6, it is possible to electrically connect the connecting portions 14 each other using the formed projections 20 as the bumps.

Apart from the example shown in the drawing, the stress relieving layer may be formed approximately flush on the surface opposed to the surface to be formed with the projections 20 in the semiconductor chip 6. In this case, the connecting portions 14 are formed on the stress relieving layer. Accordingly, the stress relieving layer (a resin, for example) can be interposed between a pair of the stacked semiconductor chips 6 with a greater area and thus the stress applied to the connection between the semiconductor chips 6 can be relaxed more efficiently.

THIRD EXAMPLE

FIG. 16 depicts a diagram illustrating a semiconductor device in the third example of the embodiment. A semiconductor chip 600 includes a plurality of the semiconductor chips 6 having the electrodes 2 and formed with the through holes 4, the conductive layer 8 including the wires 18 formed on each of the semiconductor chips 6, a plurality of the projections 20 formed on the surface either surface of the semiconductor chip 6 and a plurality of the recessed portions 22 formed on either surface of the semiconductor chip 6. Then, the projections 20 on one of a pair of the stacked semiconductor chips 6 enter the recessed portions 22 on the other the semiconductor chip 6 and thereby the connecting portions 14 are electrically connected each other.

For example, as shown in the drawing, each of the semiconductor chips 6 may be formed with the projections 20 on one surface and the recessed portions 22 on the other surface. Then, each of the semiconductor chips 6 is arranged to face the surface formed with the projections 20 to the surface formed with the recessed portions 22. At least a part of the projections 20 enters the recessed portions 22. Thereby, the contact area of the connecting portions 14 each other can be made greater and thus each of the semiconductor chips 6 can be electrically connected surely. In addition, fitting the projections 20 to the recessed portions 22 facilitates the is alignment of the semiconductor chips 6 each other.

The shape of the recessed portions 22 is preferably the shape that the projections 20 are easily entered. Additionally, as shown in the drawing, two or more projections 20 are arranged and the recessed portions 22 may be formed therebetween. Alternatively, the stress relieving layer is formed approximately flush on the surface of the semiconductor chip 6 to form depressions at predetermined positions and thereby a plurality of the recessed portions 22 may be formed, not limiting the shape of the recessed portion 22. In addition, the effect in the embodiment is as described already.

Figure 17:
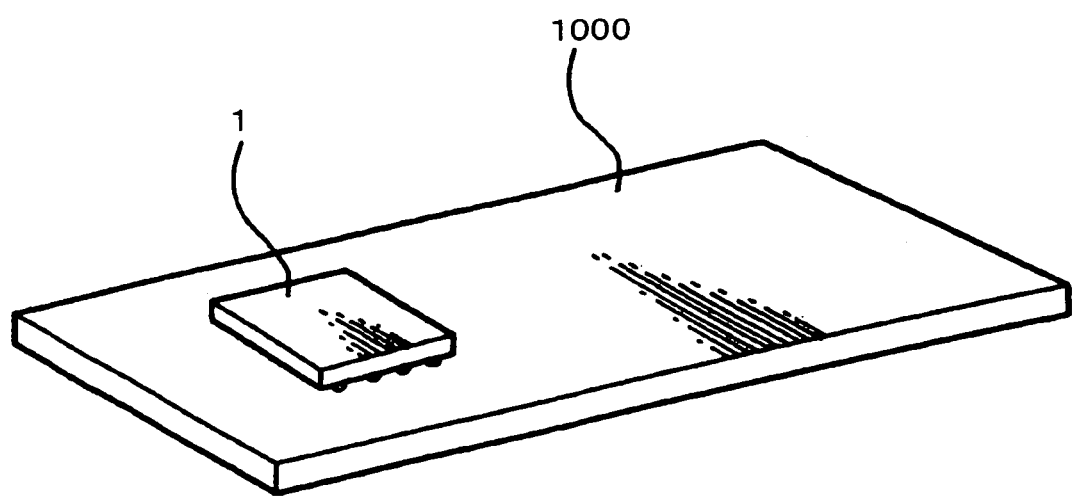
FIG. 17 shows a circuit board over which is mounted the semiconductor device according to the embodiments of the present invention.

FIG. 17 depicts a circuit board 1000 mounted with the semiconductor device 1 in the embodiment of the invention.

For the circuit board 1000, an organic substrate such as a glass epoxy substrate is generally used. The circuit board 1000 is formed with wiring patterns made of copper to be a desired circuit. These wiring patterns are mechanically connected to the external terminals 24 to be the connecting portions of the semiconductor device 1 and thereby the electrical conductivity of them is intended.

Figure 18:
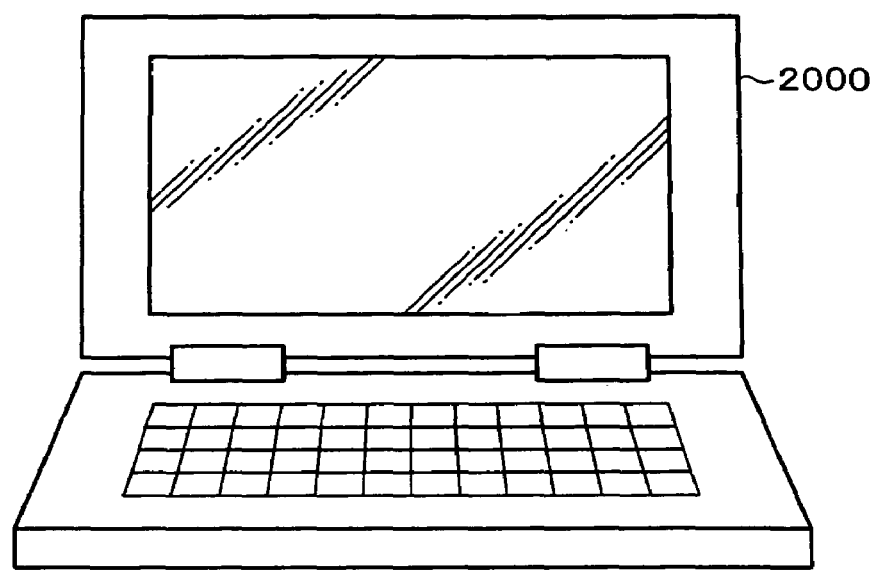
FIG. 18 shows an electronic instrument comprising the semiconductor device according to the embodiments of the present invention.
Figure 19:
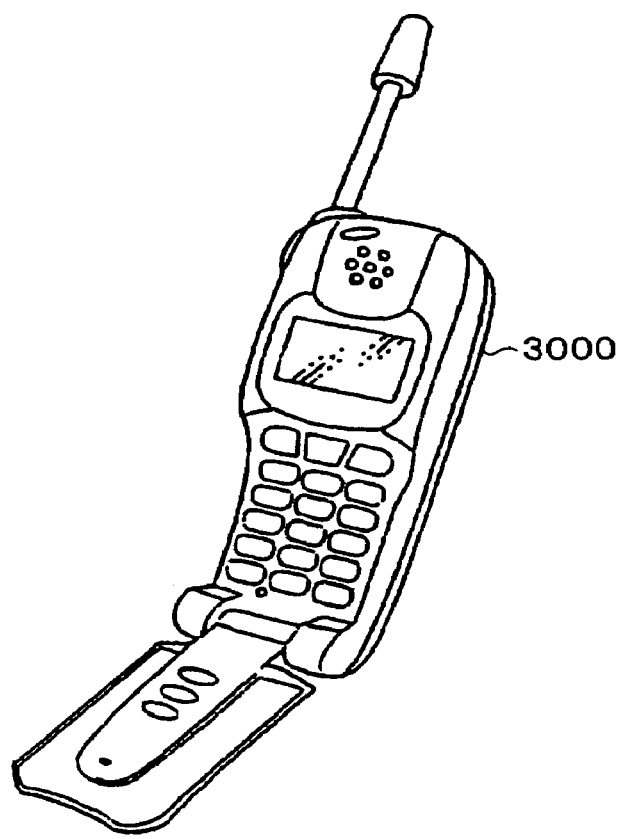
FIG. 19 shows an electronic instrument comprising the semiconductor device according to the embodiments of the present invention.

Then, as an electronic instrument applied to the semiconductor device 1 in the embodiment of the invention, FIG. 18 depicts a notebook-sized personal computer 2000 and Pig. 19 depicts a portable telephone 3000.

Additionally, "the semiconductor chip" of the embodiment as set forth is replaced with "an electronic element" and electronic components can be fabricated. Examples of electronic components fabricated by using such electronic elements include optical elements, resistors, capacitors, coils, oscillators, filters, temperature sensors, thermistors, varistors, variable resistors, or fuses, by way of example.

What is claimed is:

1. A stack-type semiconductor device formed by stacking a plurality of semiconductor devices, at least an undermost semiconductor device among the plurality of semiconductor devices comprising:
    a semiconductor element having first through holes formed therein and a plurality of electrodes formed on a first surface of the semiconductor element, each of the electrodes having second through holes formed therein, the second through holes respectively connecting with the first through holes, the second through holes having inner wall surfaces;
    an insulating film formed on a region including the inner wall surfaces of the second through holes, the insulating film having third through holes inside the second through holes, respectively;
    a conductive layer which is electrically connected to the electrodes, and is provided from the first surface through inner walls of the first through holes to a second surface of the semiconductor element, which is opposite to the first surface; and
    a plurality of connecting portions provided on the conductive layer so that a distance between two connecting portions among the plurality of connecting portions is different from a distance between at least two electrodes among the plurality of electrodes, on at least one of the first and second surfaces.

2. The stack-type semiconductor device as defined in claim 1,
    wherein the undermost semiconductor device is arranged so that the first surface of the semiconductor element faces other stacked semiconductor devices.

3. A stack-type semiconductor device formed by stacking a plurality of the semiconductor devices adjacent semiconductor devices, each of the semiconductor devices comprising:
    a semiconductor element having first through holes formed therein and a plurality of electrodes formed on a first surface of the semiconductor element, each of the electrodes having second through holes formed therein, the second through holes respectively connecting with the first through holes, the second through holes having inner wall surfaces;
    an insulating film formed on a region including the inner wall surfaces of the second through holes, the insulating film having third through holes inside the second through holes, respectively;
    a conductive layer which is electrically connected to the electrodes, and is provided from the first surface through inner walls of the first through holes to a second surface of the semiconductor element which is opposite to the first surface; and
    a plurality of connecting portions provided on the conductive layer so that a distance between two connecting portions among the plurality of connecting portions is different from a distance between at least two electrodes among the plurality of electrodes, on at least one of the first and second surfaces,
    wherein adjacent semiconductor devices are electrically connected by the conductive layer to the plurality of the semiconductor devices.

* * * * *